(12) United States Patent
Manodoro et al.

(10) Patent No.: US 9,985,573 B2
(45) Date of Patent: May 29, 2018

(54) BUILDING CONSTRUCTION SURFACE ELEMENT AND BUILDING CONSTRUCTION / BUILDING CONSTRUCTION SURFACE ARRANGEMENT AND METHOD TO MANUFACTURE SAME

(71) Applicant: DESIGNERGY SA, Lugano (CH)

(72) Inventors: Dario Manodoro, Como (IT); Federico Spinelli, Como (IT); Daniel Lepori, Castagnola (CH)

(73) Assignee: DESIGNERGY SA, Lugano (CH)

( * ) Notice: Subject to any disclaimer, the term of this patent is extended or adjusted under 35 U.S.C. 154(b) by 0 days. days.

(21) Appl. No.: 15/028,145

(22) PCT Filed: Oct. 15, 2014

(86) PCT No.: PCT/EP2014/072110
§ 371 (c)(1),
(2) Date: Apr. 8, 2016

(87) PCT Pub. No.: WO2015/055714
PCT Pub. Date: Apr. 23, 2015

(65) Prior Publication Data
US 2016/0268956 A1    Sep. 15, 2016

(30) Foreign Application Priority Data

Oct. 17, 2013   (CH) ........................................ 1768/13
May 8, 2014    (CH) ........................................ 701/14

(51) Int. Cl.
*H02S 20/22*      (2014.01)
*H02S 20/26*      (2014.01)
(Continued)

(52) U.S. Cl.
CPC ............. *H02S 20/22* (2014.12); *F24J 2/0444* (2013.01); *F24J 2/4614* (2013.01); *F24J 2/5228* (2013.01);
(Continued)

(58) Field of Classification Search
CPC .......... H02S 20/22; H02S 30/10; H02S 40/40; H02S 20/26; H01L 31/048; F24J 2/5228;
(Continued)

(56) References Cited

U.S. PATENT DOCUMENTS 4,003,363 A * 1/1977 Grossman ................ F24J 2/268
126/634
6,498,289 B1 * 12/2002 Mori ........................ H02S 40/34
126/621
(Continued)

FOREIGN PATENT DOCUMENTS

WO      97/38185 A1    10/1997

OTHER PUBLICATIONS

Feb. 19, 2015 Written Opinion of the International Searching Authority issued in International Patent Application No. PCT/EP2014/072110.
(Continued)

*Primary Examiner* — Jeanette E Chapman
(74) *Attorney, Agent, or Firm* — Oliff PLC

(57) ABSTRACT

A building construction surface element includes a PV-panel and, spaced therefrom, a building construction element including a mounting plate spaced from and facing the backside of the PV-panel and a thermal insulation plate. Spacers define for an interspace between the backside of PV module and the topside of the mounting plate. Building construction surface elements are used to finish building surfaces. As such building surfaces may possibly not be covered by an integer number of the building construction
(Continued)

Figure 1:
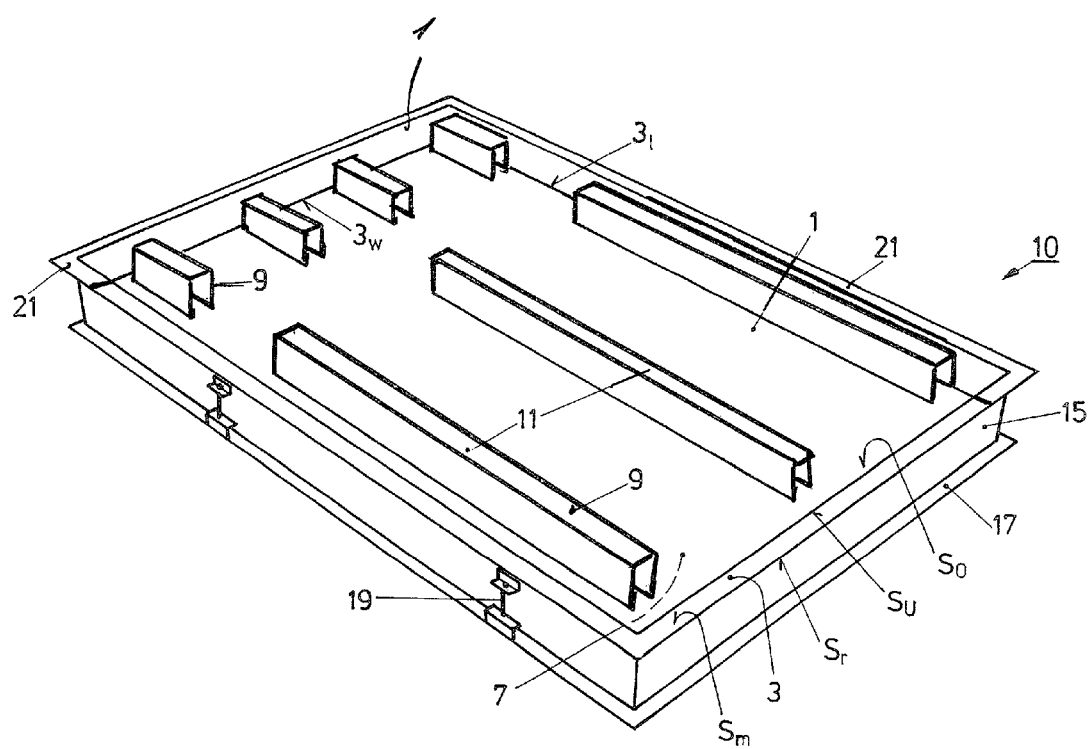

surface elements, dummy building construction surface elements may be provided which do not have a PV module, but whereon a more easily tailorable PV module fake is applied. By combining building construction surface elements with appropriately tailored dummies the building construction surface may be completely covered, thereby providing for a homogeneous optical appearance.

34 Claims, 13 Drawing Sheets

(51) Int. Cl.
| | | |
|---|---|---|
| *H02S 30/10* | (2014.01) | |
| *H02S 40/40* | (2014.01) | |
| *F24J 2/04* | (2006.01) | |
| *F24J 2/46* | (2006.01) | |
| *F24J 2/52* | (2006.01) | |
| *H01L 31/048* | (2014.01) | |

(52) U.S. Cl.
CPC ............ *H01L 31/048* (2013.01); *H02S 20/26* (2014.12); *H02S 30/10* (2014.12); *H02S 40/40* (2014.12); *F24J 2002/5294* (2013.01); *F24J 2002/5296* (2013.01); *Y02B 10/10* (2013.01); *Y02B 10/20* (2013.01); *Y02E 10/44* (2013.01); *Y02E 10/47* (2013.01)

(58) Field of Classification Search
CPC .. F24J 2/0444; F24J 2/4614; F24J 2002/5296; F24J 2002/5294; Y02B 10/10; Y02B 10/20; Y02E 10/44; Y02E 10/47
See application file for complete search history.

(56) References Cited

U.S. PATENT DOCUMENTS

| | | | | |
|---|---|---|---|---|
| 8,833,031 | B2* | 9/2014 | Steffen | ................... F24J 2/5245 52/173.3 |
| 8,835,745 | B2* | 9/2014 | Intrieri | ................... H02S 40/44 136/246 |
| 2003/0154680 | A1 | 8/2003 | Dinwoodie | |
| 2011/0041429 | A1* | 2/2011 | Rummens | .............. F24J 2/4636 52/173.3 |
| 2011/0215213 | A1* | 9/2011 | Poivet | ................... F24J 2/4614 248/309.1 |
| 2012/0149291 | A1 | 6/2012 | Roderick et al. | |
| 2012/0174504 | A1 | 7/2012 | Ferrara | |
| 2013/0008433 | A1* | 1/2013 | Hahn | ...................... F24J 2/265 126/674 |

OTHER PUBLICATIONS

Feb. 19, 2015 Search Report issued in International Patent Application No. PCT/EP2014/072110.

* cited by examiner

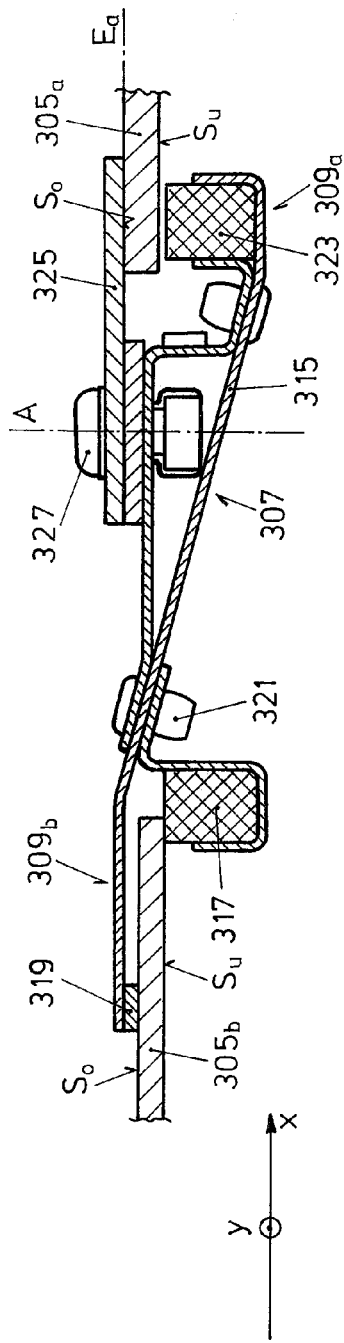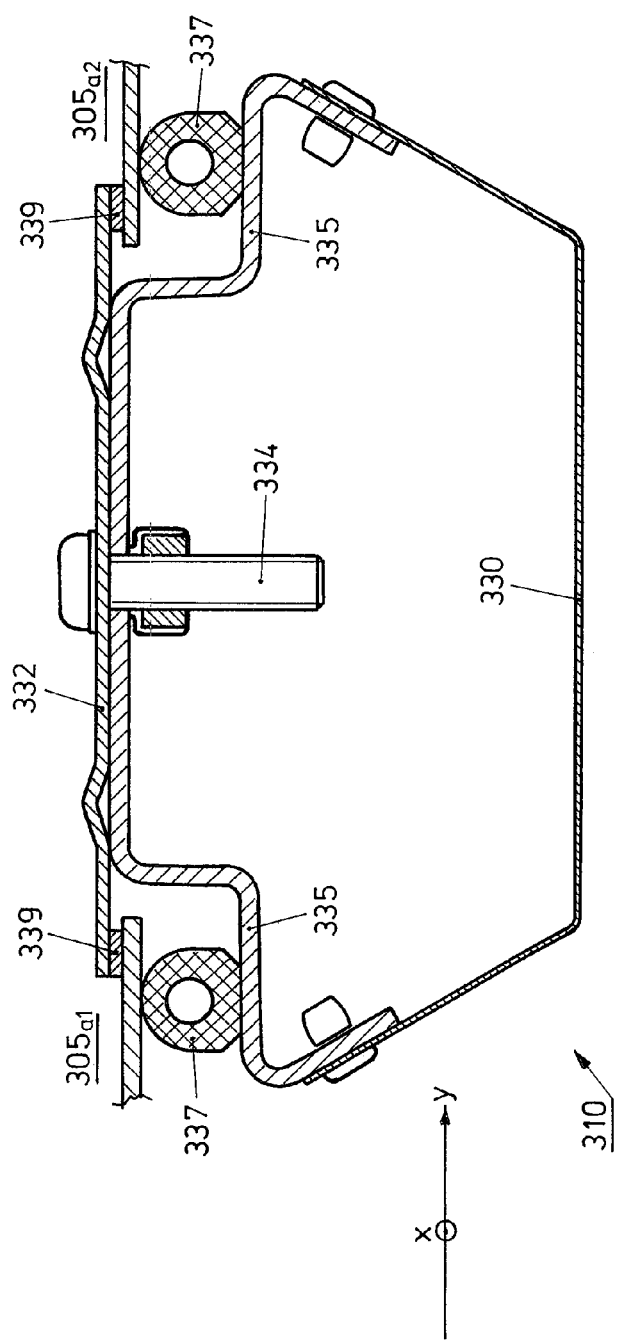

BUILDING CONSTRUCTION SURFACE ELEMENT AND BUILDING CONSTRUCTION / BUILDING CONSTRUCTION SURFACE ARRANGEMENT AND METHOD TO MANUFACTURE SAME

The invention addressed herein refers under a first aspect to a building construction surface element as well as a building construction. The invention addresses, under a second aspect, a building construction surface arrangement and a method to manufacture such arrangement.

Definitions

The term "building construction" in the context of this disclosure and claims addresses civil engineering underground or high—building construction which has a surface exposed to solar light.

The term "building construction surface element" in context with the present disclosure and claims addresses an element to be applied so as to finish the surface construction of a building construction, which surface is to be exposed to solar light. The addressed surface element is essentially plane, plate-shaped with a front surface to be exposed to solar light and a rear surface to be mounted pointing towards the remaining building construction. The thickness of such building construction surface element is in most cases less than the length and less than the width of such element. The edges of the substantially plate-shaped building construction surface element are mostly pair-wise parallel and the plate-shaped element is thus mostly rectangular or square in design.

The term "photovoltaic solar panel" or "PV-panel" addresses an essentially flat, plane arrangement of solar cells irrespective of the solar conversion technology, which is realized namely e.g. bulk crystalline Si, thin film technology, flexible module technology, organic or hybrid of solar photovoltaic and solar thermal conversion. The photovoltaic solar panel has a surface to be exposed to solar light and a back surface.

The term "solar energy converter" addresses a converter which converts solar energy into a different type of energy. Thus, a PV converter is one type of solar energy converter, another one is a solar energy to thermal energy converter.

The term "building construction element" addresses a part of a "building construction surface element" which provides for the finishing of the building construction along its surface and with respect to requirement for the building construction per se as with respect to mechanical stability, thermal insulation, water proofness etc.

Building construction surface elements incorporating solar converters as well as a building construction element are known e.g. from the WO 2013/092682.

First Aspect of the Invention

It is an object of the present invention under its first aspect to improve such a building construction surface element especially when equipped with a photovoltaic solar panel.

This object is resolved by a building construction surface element which comprises a photovoltaic solar panel with a surface to be exposed to solar light and a back surface. The addressed building construction surface element further comprises a mounting plate with a mounting surface parallel to and spaced from the back surface of the photovoltaic solar panel by a venting interspace which extends substantially all along the back surface of the photovoltaic solar panel and the addressed mounting surface. The mounting plate has further a rear surface. There is further provided a spacer arrangement which is fixed to the back surface of the photovoltaic solar panel, on one hand, and to the mounting surface, on the other hand, and which holds the back surface in spaced position with respect to the mounting surface. There is further provided a thermal insulation plate which is fixed to the rear surface of the mounting plate and which extends substantially all along the rear surface.

The mounting plate acts as a first building construction element in that it provides beside of an accurate and stable mount for the PV solar panel also mechanical stability and tightness of the overall building construction surface element and thus for the remaining building construction to which the building construction surface element is applied so as to finish the building construction.

The thermal insulation plate as well acts as a building construction element especially with respect to thermal insulation which is provided by such thermal insulation plate of the building construction surface element effective for the building construction it is part of. The thermal insulation plate may, additionally to providing thermal insulation, act as a heat-storage element and/or as an acoustical insulation element and may be realized by a single material plate or by a composite, sandwich-structured plate.

Further and as will be exemplified later, the spacer arrangement too may significantly contribute to mechanical stability of the building construction surface element and thus to the surface of the building construction such surface element is part of.

The addressed parts of the building construction surface element are fixed together so that such surface element is a unitary part to be mounted to the remaining building construction.

In one embodiment of the building construction surface element according to the invention, which may be combined with any of the embodiments still to be addressed, unless in contradiction, the spacer arrangement comprises at least one of the following spacers:
  hollow or full material studs;
  hollow or full material linear or curved bars;
  half-timbered or framework bars.

These different realization forms of spacers may be combined. Especially if the addressed spacers are formed by or comprise framework bars, the overall mechanical stability of the building construction surface element is significantly improved. Depending on the amount of spacers distributed between the back surface of the PV-panel and the mounting surface of the mounting plate, bending stress of the PV-panel may significantly be reduced with respect to punctual loads. This is especially true if the spacers comprise or are formed by the addressed framework bars, because such bars on one hand establish accurate mechanical support along significantly extended surfaces and nevertheless maintain the venting interspace between the back surface of the PV panel and the mounting surface of the mounting plate wide open.

In one embodiment of the building construction surface element according to the invention which may be combined with any of the preaddressed embodiments and with any of the embodiments still to be addressed, unless in contradiction, the spacers are at least one of profiled sections of the mounting plate and of distinct elements. As the mounting plate is in one embodiment of a metal or of a plastic material, today preferred of aluminum, even of a sandwiched material, which may be formed, the spacers may be profile-formed, e.g. pressed or cast or molded into the mounting plate. On the other hand the spacers may be provided as distinct elements fixed to the mounting plate e.g. by soldering, screwing, gluing etc. It is absolutely possible to combine spacers shaped into the mounting plate with spacers provided as distinct elements and/or differently shaped spacers. In a good embodiment the mounting plate is today realized by an aluminum plate.

In one embodiment of the building construction surface element according to the invention, which may be combined with any of the preaddressed embodiments and embodiments still to be addressed, unless in contradiction, the photovoltaic solar panel is glued to the spacer arrangement.

In one embodiment of the building construction surface element according to the invention, which may be combined with any of the preaddressed embodiments and embodiments still to be addressed, unless in contradiction, the addressed surface element comprises at least one membrane band or strip of waterproof, preferably flexible material which is/are sealingly mounted, e.g. glued along at least a part of the periphery of the mounting plate and/or the PV panel and which has/have a width and is/are mounted to the mounting plate and/or the PV panel so as to freely project over the edge of the mounting plate and/or PV panel by a part of its width extent. Thus, in a good embodiment such a membrane band is glued along a length edge as well as along a width edge of the mounting plate or the respective edges of the PV panel or one such band to the edges of both. When additional building construction surface elements are provided to finish the surface of a building construction, the addressed waterproof band, in a good embodiment provided, as was addressed, in L-shape along a length-edge and a width edge of the mounting plate and/or the PV panel, allows to bridge a gap between adjacent building construction surface elements in a waterproof manner. Clearly, such band of one building construction surface elements may per se be exploited to bridge in a waterproof manner the addressed gap or, alternatively, two bands applied to the mounting plates and/or PV panels of adjacent and neighboring building construction surface elements may be used in combination to commonly bridge the intermediate gap between such neighboring building construction surface elements. If the waterproof band is to be exposed to solar light, its material should be UV-resistant.

In one embodiment of the building construction surface element, which may be combined with any of the preaddressed embodiments and embodiments still to be addressed, unless in contradiction, there is provided at least one extended sealing member, extending along at least a part of the periphery of the PV-panel, at least one of along the surface to be exposed to solar light and of the back surface, preferably along the latter and/or along at least a part of the periphery of the mounting plate. Thus, e.g. along one or both of the length edges and/or of the width-edges of the PV panel and/or of the mounting plate there may be provided e.g. glued, a strip-shaped seal e.g. of rubber-elastic material which is exploited when mounting the building construction surface element to the remaining building construction so as to establish water proofness along an interspace or gap between neighboring building construction surface elements. Providing such elongated extended sealing members at the PV panel and/or the mounting plate may significantly facilitate proper inter-sealing of multiple building construction surface elements. In a good embodiment such an elongated or extended sealing member is applied e.g. glued to the back surface of the PV panel or to the mounting plate's rearside so as to reduce exposure to UV radiation, once the surface element is mounted to the remaining building construction.

In an embodiment of the building construction surface element according to the invention, which may be combined with any of the preaddressed embodiments and embodiments still to be addressed, unless in contradiction, the thermal insulation plate is of one or more than one of the following materials:

Polyurethane, PUR;
Polyisocyanurate, PIR;
Polyethylene terephthalate, PET;
Rockwool;
Expanded perlite;
Wood fibre;
Insulating paint.

In one embodiment of the building construction surface element, which may be combined with any of the preaddressed embodiments and embodiments still to be addressed, unless in contradiction, there is provided along the thermal insulation plate and opposite the mounting plate a further mounting plate. Similar to the mounting plate, the further mounting plate may be of a metal or of a plastic material. In a good embodiment as today realized it is of aluminum.

Although it might be not necessary to provide such a further mounting plate, some of good materials for realizing the thermal insulation plate, as especially rockwool, make it necessary to hold the thermal insulation plate firmly between opposite plates, the mounting plate and the further mounting plate. The mounting plate and/or the further mounting plate may also be constructed as composite, sandwich-structured plates.

In one embodiment of the just addressed embodiment, i.e. with a further mounting plate, the thermal insulation plate is squeezed between the mounting plate and the further mounting plate by means of tie bars mounted to the mounting plate on one hand and to the further mounting plate on the other hand. At least a part of such tie bars, along their length extent, is of a thermally non-conductive material, in a good embodiment of a plastic material. Realizing the addressed part of the tie bars by a thermally non-conductive material avoids to establish thermal bridges between the mounting plate and the further mounting plate, which would deteriorate the thermal insulation effect of the thermal insulation plate.

In one embodiment of the embodiments of the building construction surface element according to the invention, which are provided with a further mounting plate, the addressed further mounting plate is glued to the thermal insulation plate.

In one embodiment of the building construction surface element according to the invention, which may be combined with any of the preaddressed embodiments and embodiments still to be addressed, unless in contradiction, the thermally insulating plate is glued to the mounting plate.

In one embodiment of the building construction surface element according to the invention, which may be combined with any of the preaddressed embodiments and embodiments still to be addressed, unless in contradiction, the thermal insulation plate is of or comprises a plate-layer of rockwool.

As was addressed above the present invention is further directed on a building construction. According to the invention such building construction comprises at least two of the building construction surface elements as were addressed above. Such building construction elements may be equal or unequal and are constructed according to the present invention or according to one or more than one of its embodiments and combinations thereof addressed above. At least one of the addressed surface elements comprises a membrane band or strip of waterproof, preferably flexible material, sealingly mounted to at least one edge extending length-wise and/or width-wise along at least one of the the mounting plate and of the PV panel. The addressed building construction surface elements are mounted side by side and mutually separate by a gap. The membrane band of waterproof material of at least one of the building construction surface elements sealingly bridges at least a part of the gap. Thus, if from the neighboring building construction surface elements only one is pre-assembled with the waterproof band, then the gap is bridged by this one waterproof band and is sealingly fixed, e.g. glued, to the parallel edge of second surface elements mounting plate and/or PV panel, which has no waterproof band.

Thus in such a building construction the gap between adjacent building construction surface elements is bridged in a waterproof manner either by a membrane band sealingly extending from the edge of the mounting plate of one of the addressed building construction surface elements to the edge of the mounting plate of the other building construction surface element, or the gap is sealingly bridged by a membrane band from the edge of the PV panel of one of the adjacent building construction surface elements to the edge of the PV panel of the other of the building construction surface elements. It may even be possible and advantageous to double-bridge the gap by an addressed membrane band between the edges of adjacent PV panels on one hand and the edges of adjacent mounting plates on the other hand.

If both of the neighboring building construction surface elements are provided along their parallel edges of the mounting plates and/or the PV panels, separate by the gap, with the addressed waterproof membrane band, then the gap is bridged respectively by both addressed waterproof bands in combination. It might not be necessary to span the one or more than one waterproof bands tightly across the gap, but it might even be advantageous to sealingly bridge the gap by the one or the two waterproof bands loosely, so as to form a depression channel for removing water.

The membrane band may thereby possibly be of substantially rigid material, e.g. sealingly and possibly pivotably mounted to an edge of the mounting plate or of the PV module so that such more rigid material membrane band may be pivoted or deposited into contact with the edge of the adjacent mounting plate or PV panel of the adjacent building construction surface element and fixed thereto e.g. by sealingly gluing. In a today preferred form of realization the addressed membrane band or bands is or are realized as flexible foils.

It might even be possible and in some instances advantageous to realize the addressed membrane band overlapping the respective edges by a layer along one of the mounting surface or the rear surface of the mounting plate or along the full surface of the backside of the PV module or both, if the PV modules as well as the mounting plates shall be bridged by respective membrane bands.

Under one aspect of the invention under the first aspect, the building construction according to the present invention which comprises at least two of the building construction surface elements as were addressed above under the most general aspect of the invention or by one or more than one of its embodiments as addressed, the at least two building construction surface elements are mounted side by side and mutually separate by a gap. This building construction comprises a mechanically biased sealing arrangement which bridges the gap along the edges of at least one of the PV-panels and of the mounting plates. In this building construction, neighboring building construction surface elements are sealingly combined by providing between and along the edges of their respective PV panels an elongated gap-bridging mechanically biased sealing arrangement.

Nevertheless, it is absolutely possible, as also exemplified below, to combine sealingly closing the addressed gap by means of a membrane band or strip of waterproof material as was addressed above and additionally by means of a mechanically biased sealing arrangement which bridges the addressed gap. Thus, in one embodiment of the just addressed embodiment of providing a mechanically biased sealing arrangement, at least one of the building construction surface elements is constructed with at least one membrane band or strip of waterproof, preferably flexible material which is/are sealingly mounted e.g. glued along at least a part of the periphery of the mounting plate and/or of the PV panel and which has/have a width and is/are mounted to the mounting plate and/or the PV panel so as to freely project over the edge of the mounting plate and/or PV panel by a part of its width extent and thereby exploiting the addressed membrane band of waterproof material additionally to the mechanically biased sealing arrangement to bridge at least a part of the gap.

Thus, somehow summarizing and at a building construction according to the invention with at least two neighboring building construction surface elements, the gap between the addressed surface elements is bridged in a waterproof manner e.g. in one of the following variants:
  a) one waterproof membrane band bridges the gap between the parallel edges of the two neighboring mounting plates;
  b) two membrane bands in combination bridge the parallel edges of the two adjacent mounting plates;
  c) one membrane band bridges the parallel edges of the PV panels of the adjacent surface elements;
  d) two membrane bands in combination bridge the parallel edges of the PV panels of adjacent surface elements;
  e) a combination of the variants a) or b) with one of the variants c) or d).

We have just addressed providing mechanically biased sealing arrangements. The variants a) to e) are based on providing a membrane band which per se and due to chemical fixation as of gluing to respective parallel edges forms a waterproof barrier. When we speak of a "mechanically biased sealing arrangement" we understand an arrangement at which sealingness is achieved by compressing a seal element as of rubber-like material, by compressing forces.

Addressing such mechanically biased sealing arrangement such arrangement may be provided in different variants as:
  A) a mechanically biased sealing arrangement bridges the PV panels of the adjacent building construction surface elements;
  B) a mechanically biased sealing arrangement bridges the parallel edges of the mounting plates of adjacent building construction surface elements;
  C) a mechanically biased sealing arrangements bridge the parallel edges of the PV panels as well as the parallel edges of the mounting plates of the adjacent building construction surface elements.

In combination further variants of establishing a waterproof bridging of the addressed gap are e.g.
  a) or b) with A)

c) or d) with B)

Today preferred is the combination of a) or b) with A).

In one embodiment of the building construction, whereat the membrane band of waterproof, preferably flexible, foil-like material of at least one of the building construction surface elements sealingly bridges at least a part of the gap, there is additionally provided a mechanically biased sealing arrangement which bridges the gap all along the parallel edges of the photovoltaic solar panels.

In one embodiment of the just addressed embodiments of the building construction according to the invention, which may be combined with any preaddressed embodiment or embodiment of such building construction to be addressed, if not in contradiction, the mechanically biased sealing arrangement comprises at least one elongated bridging plate arrangement. The elongated bridging plate arrangement bridges the gap and comprises a first extended edge portion which overlaps the PV panel of the one of the building construction surface elements along its back surface. The elongated bridging plate arrangement further comprises a second extended edge portion which extends substantially parallel to the first extended edge portion, whereby the just addressed second edge portion overlaps the PV panel of the second of the at least two building construction surface elements along its surface to be exposed to solar light.

Thus, the addressed elongated bridging plate arrangement overlaps the PV panel of one of the building construction surface elements which define for the gap on the backside of the PV panel, whereas the addressed elongated bridging plate arrangement overlaps the second one of the PV panels, of the second building construction surface element defining the gap, on its upper side, i.e. the side or surface to be exposed to solar light. Thus, by the addressed elongated bridging plate arrangement the two building construction surface elements are joined in an imbricated manner.

In one embodiment of the just addressed embodiment of the building construction the surface to be exposed to solar light and the back surface, of the respectively addressed PV panels extend along planes which are preferably at least substantially parallel. Thereby, these planes may form a common plane. In this case the addressed surface exposed to solar light and the addressed back surface are disposed in one common plane. Alternatively, the addressed planes may be mutually spaced or may intersect.

Accordingly, the elongated bridging plate arrangement is profiled so as to overlap the addressed back surface as well as surface to be exposed to solar light.

In one embodiment of the building construction with imbricated elongated bridging plate arrangement, which may be combined with any embodiment of such building construction preaddressed as well with any embodiment of such building construction still to be addressed, unless in contradiction, the first extended edge portion, which, as was defined, overlaps the respective PV panel along its back surface, comprises a first extended sealing member which is biased towards the back surface. Additionally or alternatively, the second extended edge portion, which, as was defined, overlaps the surface to be exposed to solar light of the respective PV panel comprises a second extended sealing member which is biased towards one of the surface to be exposed to solar light and the back surface of the respective PV panel.

In one further embodiment of the building construction of the type comprising an imbricated elongated bridging plate arrangement, which may be combined with any of the preaddressed embodiments of such building construction and with any embodiment of such building construction still to be addressed, unless in contradiction, the first and second extended edge portions are edge portions of a plate member.

One embodiment of the building construction of the type comprising an imbricated elongated bridging plate arrangement and which may be combined with any preaddressed embodiment of such building construction and with any embodiment of such building construction still to be addressed, unless in contradiction, the first and second extended edge portions are linked by an extended central part. The elongated bridging plate arrangement comprises at least one of a biasing member mounted to the central part and applicable in an overlapping manner over the surface to be exposed to solar light opposite the first extended edge portion and of a biasing member mounted to the central part and applicable in an overlapping manner over the back surface opposite the second extended edge portion.

Thus, by the addressed biasing members at least one of the extended edge portions is biased towards the respective surface of a PV module, the back surface or the surface to be exposed to light. Thereby a sealing engagement of the respective edge portion to the respective PV panel is established.

In an embodiment of the just addressed embodiment of the building construction, the at least one biasing member is mounted pivotably on the extended central part, pivotable about an axis which is substantially perpendicular to that surface of that PV panel to which the addressed biasing member is to be applied to in an overlapping manner.

In a further embodiment of the building construction of the type comprising an imbricated elongated bridging plate arrangement, which may be combined with any preaddressed embodiment of such building construction and with any embodiment of such building construction still to be addressed, unless in contradiction, the PV panels of the at least two building construction surface elements as provided are positioned inclined with respect to vertical orientation, as is the case e.g. when the building construction is a part of pitched roof. Thereby, the elongated bridging plate arrangement extends substantially in horizontal direction and the first extended edge portion which is overlapping the back surface of one of the PV panels is located on a higher position level than the second extended edge portion which overlaps the surface to be exposed to solar light of the second PV panel.

Thereby, there is exploited that the imbricated mount of the elongated bridging plate arrangement is especially suited to bridge substantially horizontally extended gaps between inclined building construction surface elements.

In a further embodiment of the building construction of the type comprising an imbricated elongated bridging plate arrangement as defined, which may be combined with any preaddressed embodiment of such building construction and with any embodiment of such building construction still to be addressed, unless in contradiction, there are provided at least four building construction surface elements which are mounted crosswise, side by side and mutually separated by two intersecting gaps. The mechanically biased sealing arrangement as was addressed above bridges one of the intersecting gaps. The building construction further comprises a further mechanically biased sealing arrangement which bridges the second of the two intersecting gaps. This further mechanically biased sealing arrangement comprises an extended water collection channel arrangement which extends below and crosses in an overlapping manner at least end portions of the one mechanically biased sealing arrangements. Such overlapping is realized in a gap area which is defined by the intersection of the two gaps and the addressed water collection channel bridges said gap area.

Thus, any water which penetrates especially in the addressed gap area, the crossing center of the two intersecting gaps, is collected by the water collection channel arrangement.

If, as was addressed above, the building construction is positioned inclined with respect to vertical orientation in the manner of a pitched roof surface, then the one imbricated elongated mechanically biased sealing arrangement prevents along the substantially horizontally oriented gaps water to penetrate towards the building. The addressed water collection channel arrangement collects water which might penetrate at the addressed gap area towards the building.

In one embodiment of the just addressed embodiment, the further mechanically biased sealing arrangement, which comprises the water collection channel arrangement further comprises an extended cover plate arrangement which extends along and covers the water collection channel arrangement. The addressed extended cover plate crosses in an overlapping manner at least an end portion of the mechanically biased sealing arrangement in the gap area defined by the intersection of the two gaps and bridges such gap area.

As was already addressed above, and on one hand, in one embodiment of the building construction, which might be combined with any of the preaddressed embodiments of such building construction and with any of the subsequently addressed embodiments, unless in contradiction, either both of the building construction surface elements have a waterproof material membrane band and these bands or waterproof material conjointly bridge the gap or only one of the building construction surface elements has such waterproof material band, and it is this band which bridges the gap.

In one embodiment of the building construction, which may be combined with any of the preaddressed embodiments and embodiments still to be addressed, unless in contradiction, there is provided a mechanically biased sealing arrangement bridging the gap along the edges of the PV panels and/or mounting plates, such sealing arrangement comprises at least one elongated bridging plate which extends along the gap and which overlaps the edges of the PV panels, either along the backside surfaces of the PV panels or along those surfaces of the PV panels which are to be exposed to solar light or overlaps the edges of the mounting plate or, if two mechanically biased sealing arrangements are provided, the one elongated bridging plate extends between the edges of the PV panels, a second one between the edges of the mounting plates. There is further provided a pair of elongated sealing members, e.g. of rubber-elastic material, which pair extends all along the gap and between the elongated bridging plate and the respective surface of the PV-panels and/or of the mounting plates. Thereby, each of the addressed elongated sealing members may be a separately applied member, a member fixed to the elongated bridging plate or a member fixed, e.g. glued, to one of the surfaces of the PV panel or of the mounting plate. The building construction further comprises at least one biasing member, which bridges the gap and overlaps the surfaces of the PV panels or of the mounting plates opposed to their surfaces whereon the elongated sealing members rest. The elongated bridging plate and the at least one biasing member are mutually biased, e.g. by tensioning bars which, in one embodiment, are screw bars.

Thus, looking at two neighboring building construction surface elements and an intermediate gap, there is provided either along the surface edges of the involved PV panels to be exposed to solar light or along their back surface edges and/or along one of the surfaces of the mounting plates a pair of the addressed elongated sealing members, e.g. with the shape of sealing stripes. The elongated bridging plate is applied to the addressed sealing members from one respective side of the PV panels or mounting plates and is firmly held and biased by the action of the at least one biasing member, which resides on the opposed surfaces of the PV panels or mounting plates with respect to those surfaces where the elongated sealing members as well as the elongated bridging plate are applied.

In one embodiment of the just addressed embodiment the biasing member is itself a further elongated bridging plate extending along the gap. In this embodiment and as a further embodiment a further pair of the elongated sealing members may be provided between the further elongated bridging plate and a respective surface of the PV panels or mounting plates.

In a further embodiment of the embodiment as addressed above with the at least one elongated bridging plate, at least two biasing plates are provided distributed along the gap and resting on the surfaces of the PV panels and/or mounting plates, preferably via rubber-elastic members. In this embodiment there is thus provided only one elongated bridging plate cooperating with the pair of elongated sealing members. The addressed elongated bridging plate is biased towards the PV panel or mounting plate via the pair of elongated sealing members, by means of the addressed at least two biasing plates residing on the opposite sides of the two neighboring PV panels or mounting plates and with respect to that side of the addressed panels or plates, at which the bridging plate as well as the elongated sealing members are provided.

In one embodiment of the building construction according to the invention and provided with the at least one elongated bridging plate, such at least one elongated bridging plate is provided to overlap the back surfaces of the PV panels. Thus and in this embodiment the pair of elongated sealing members are provided along and biased towards the back surfaces of the PV panels and are thus shielded from ambient UV radiation.

In a further embodiment of the building construction according to the invention provided with a mechanically biased sealing arrangement bridging the gap between two neighboring building construction surface elements there are provided at least four of the addressed building construction surface elements. The four building construction surface elements are mounted side by side and mutually separate by a cross of gaps. At each of the gaps there is provided one of the addressed mechanically biased sealing arrangements bridging each of the addressed gaps of the cross along the parallel edges of respective PV panels. The addressed mechanically biased sealing arrangements terminate adjacent to a center area of the cross of the gaps. There is further provided a cross-center sealing arrangement which as well is preferably a mechanically biased seal arrangement, which sealingly interconnects the ends of the addressed mechanically biased sealing arrangements as well as the four corners of the building construction surface elements, which border the center area of the cross of gaps.

In a further embodiment of the building construction according to the invention, which comprises an elongated bridging plate, at least four building construction surface elements are provided and the at least four building construction surface elements are mounted side by side and mutually separate by a cross of gaps. At least one of the addressed elongated sealing plates bridges each of the gaps of the cross along the parallel edges of respective PV panels or mounting plates and terminates adjacent to a center area of the cross. This embodiment further comprises a cross-center sealing arrangement which latter comprises at least one cross-center covering plate which overlaps the four neighboring corners of the four adjacent building construction surface elements. There is further provided a seal member loop along the periphery of the addressed cross-center covering plate and between the addressed cross-center covering plate, the addressed four corners and the ends of the four elongated bridging plates, preferably intersecting with the pairs of elongated seal members.

A biasing cross-center member is further provided which bridges the center area of the cross of gaps and which overlaps at least one of the four corners and the four elongated bridging plates, whereby the biasing cross-center member and the cross-center covering plate are mutually biased by at least one tensioning bar which is, in a good embodiment, a screw bar.

We have addressed different variants or embodiments of building constructions according to the present invention, whereat two or more than two building construction surface elements are provided and gaps formed between adjacent building construction surface elements are bridged by means of mechanically biased sealing arrangements in different forms of realization. So as to further exploit such mechanically biased sealing arrangements which will form a pattern along the building construction, such mechanically biased sealing arrangements are tailored to comprise extended metallic members which are electro-conductively joined so as to form along the building construction a pattern or grid of electrical conductors. Thereby, this pattern or grid of electric conductors is exploited as a part of a lightning protection system for the respective building.

Second Aspect of the Invention

Surfaces of building constructions are customarily predetermined as by desires and wishes of the constructor especially as concerns their shape and dimension. The surface of a building construction may e.g. be interrupted by openings for windows, for chimneys, etc. Moreover, the addressed surface of a building construction may be provided e.g. with bordering edges having corners, being curved or bent and defining salient parts.

Industrially manufactured building construction surface elements which comprise or are formed by solar energy converter modules or -panels are customarily manufactured in distinct, even in standardized dimensions and may not be tailored in any desired shapes and dimensions. Providing such building construction surface elements which are made of or which comprise a solar energy converter module or -panel along a building construction surface will mostly result in that some surface areas are not covered by such addressed industrially manufactured building construction surface elements. This leads to an inhomogeneous visual appearance of the surface of such building constructions.

Under the second aspect of the present invention it is an object to remedy the addressed drawback.

This object is resolved according to the invention under its second aspect by a building construction surface arrangement which comprises first building construction surface elements having each a first surface exposed to the surrounding of the building construction surface arrangement wherefrom solar energy originates. The first surface is a surface of a solar energy converter module, upon which the solar energy is to impinge. There is further provided at least one second building construction surface element, which has a second surface exposed to the addressed surrounding. Thereby, the second surface is not a surface of a solar energy converter module. This surface is conceived so as to provide a visual appearance which is substantially equal to the visual appearance of the first surfaces, i.e. those surfaces which are formed by the solar energy converter modules.

Thus, in fact, besides of the addressed first building construction surface elements being formed respectively by a solar energy converter module or comprising such solar energy converter module, there is provided at least one second type of building construction surface element without such solar energy converter module, which nevertheless looks like the addressed first type building construction surface element, but is in fact a "fake" or "dummy" of such first construction surface element as just looking like being provided with a solar energy converter.

One must consider that it is predominantly the solar converter module of a building construction surface element which prevents such element being cut or tailored to an individual, desired shape so as to be adapted to specific remaining shapes of areas of a building construction surface which may not be covered by industrially manufactured first type building construction surface elements. By the addressed "dummy" second type building construction surface elements without a solar energy converter module it becomes possible to adaptively tailor such second type elements on the place of construction according to the respective needs for complementing the overall covering of a building construction surface, irrespective of its dimensions and shape.

Whereas this is especially true if the first type building construction surface elements are or comprise PV panels as solar energy converter modules, the same approach may also prevail for other first building construction surface elements, e.g. consisting of or at least comprising thermal solar energy converters.

In a good embodiment of the addressed arrangement, which may be combined with any embodiment still to be addressed of such arrangement, unless in contradiction, the shape of the at least one second building construction surface element is individually and adaptively tailored, adapted to the shape of at least a part of the surface area to be covered but which may not be covered by the first type building construction surface elements.

Thus, the overall shape of the building construction surface covered by the addressed arrangement may individually be adapted as by cutting or sawing of the second building construction surface element, thereby guaranteeing a visual appearance of the overall covered area which is at least substantially homogeneous.

In a further good embodiment of the addressed arrangement according to the second aspect of the present invention, which may be combined with the preaddressed embodiment and with any of the embodiments still to be addressed of the invention under its second aspect if not in contradiction, the first as well as the second building construction surface element comprise a building construction element. Thus, the first building construction surface elements not only each comprise a solar energy converter, they each additionally comprise a building construction element which fulfils requirements for the building construction per se as with respect to mechanical stability, thermal insulation, waterproofness, etc.

Any layers or plates of the second building constructions surface element may be tailored e.g. by cutting on the place of construction of the arrangement. The second building construction surface element provides at least substantially for the same characteristics as the addressed building construction elements implemented in the first building construction surface element.

In a good embodiment the second building construction surface element comprises the same building construction element as integrated also in the first building construction surface element.

The second element may thereby just differ from the first building construction surface element by a material plate exposed to the surrounding and to impinging solar light which visually "simulates" presence of a solar energy converter module.

According to a today's preferred embodiment of the arrangement the solar energy converter modules of the first building construction surface elements at least comprise PV modules. Thereby, it is absolutely possible to either provide a part of the addressed first building construction surface elements with PV modules, other parts with thermal solar energy converters and/or to provide at the addressed first building construction surface elements in combination both, i.e. PV modules as well as thermal solar energy converters.

In a further good embodiment of the addressed arrangement under the second aspect of the invention, which may be combined with any such preaddressed embodiment or embodiment still to be addressed, unless in contradiction, the second surface, which visually simulates the surface of a solar energy converter, is the surface of a metal plate, thereby preferably at least comprising aluminum.

In a further good embodiment, today preferred, which may be combined with any of the preaddressed embodiments under the second aspect of the present invention and embodiments of that aspect still to be addressed, unless in contradiction, the first building construction surface elements are conceived as discussed and claimed under the first aspect of the present invention.

In a further good embodiment of the embodiment just addressed, the arrangement comprises a building construction as is amply discussed and claimed under the first aspect of the present invention.

The second aspect the present invention is further directed on a method of manufacturing a building construction surface arrangement along a building construction surface area which comprises providing a support structure and mounting a multitude of first building construction elements on the support structure and along at least one surface area of said building construction surface area. Thereby, each first building construction element comprises a solar energy converter module or is formed by such solar energy converter module, having a first surface exposed to ambient, wherefrom the solar energy originates.

The at least one surface area is complemented by at least one second building construction element which does not comprise a solar energy converter. The second building construction element has a second surface which is exposed to ambient, wherefrom the solar energy originates and has a visual appearance substantially equal to the visual appearance of the first surface. Thereby, the second building construction element is adaptively tailored with respect to shape so as to optimally perform said complementing of the at least one surface area, preferably towards the complete area to be covered of the building construction surface.

Clearly, this method may be performed with the help of any of the first building construction elements as amply explained and claimed under the first aspect of the invention and may incorporate mounting of a building construction as also amply addressed and claimed under the first aspect of the present invention.

The invention under the first, the second and a combined aspect shall now be further exemplified with the help of figures.

Figure 7:
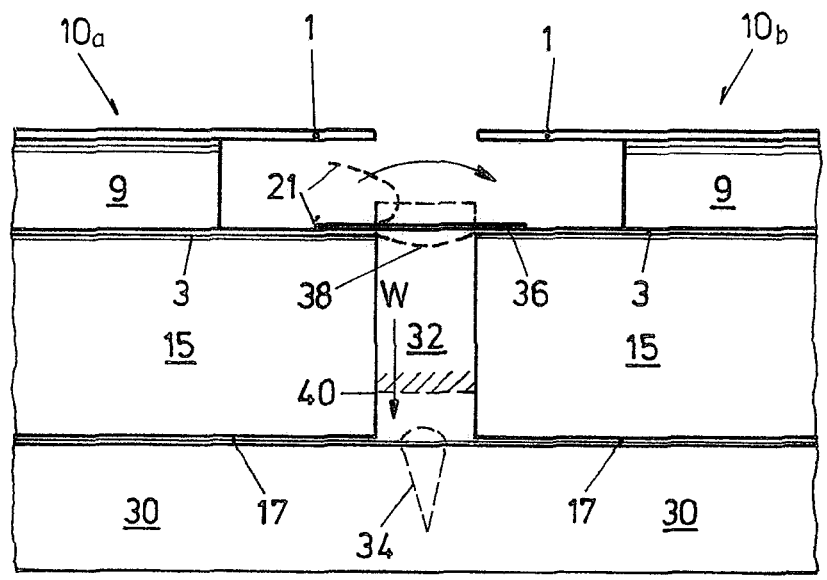
Figure 8:
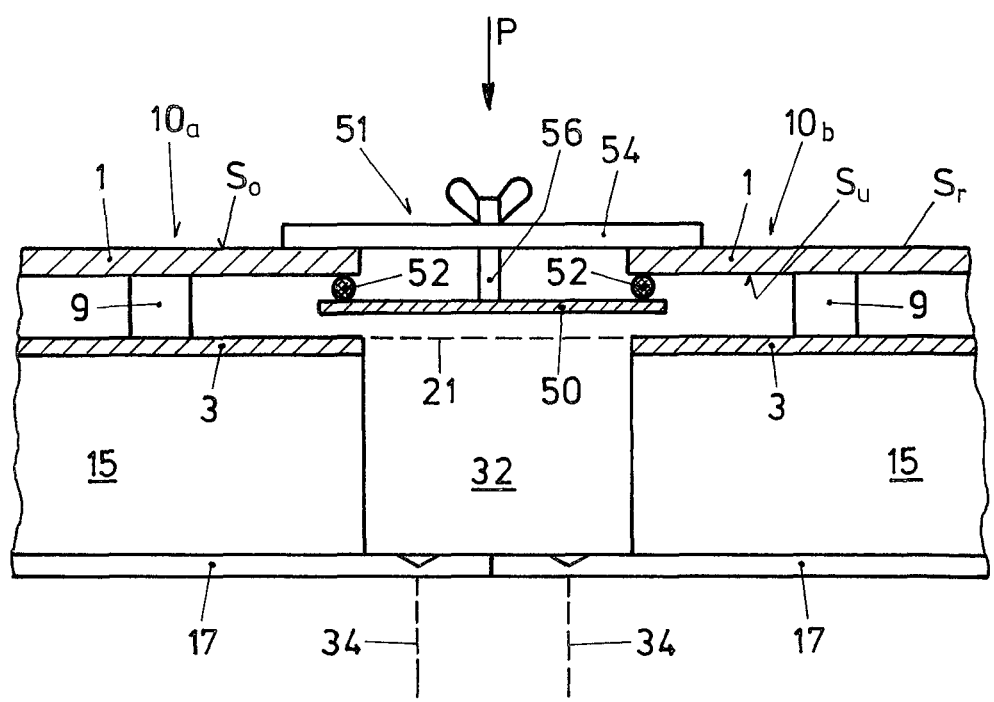
Figure 9:
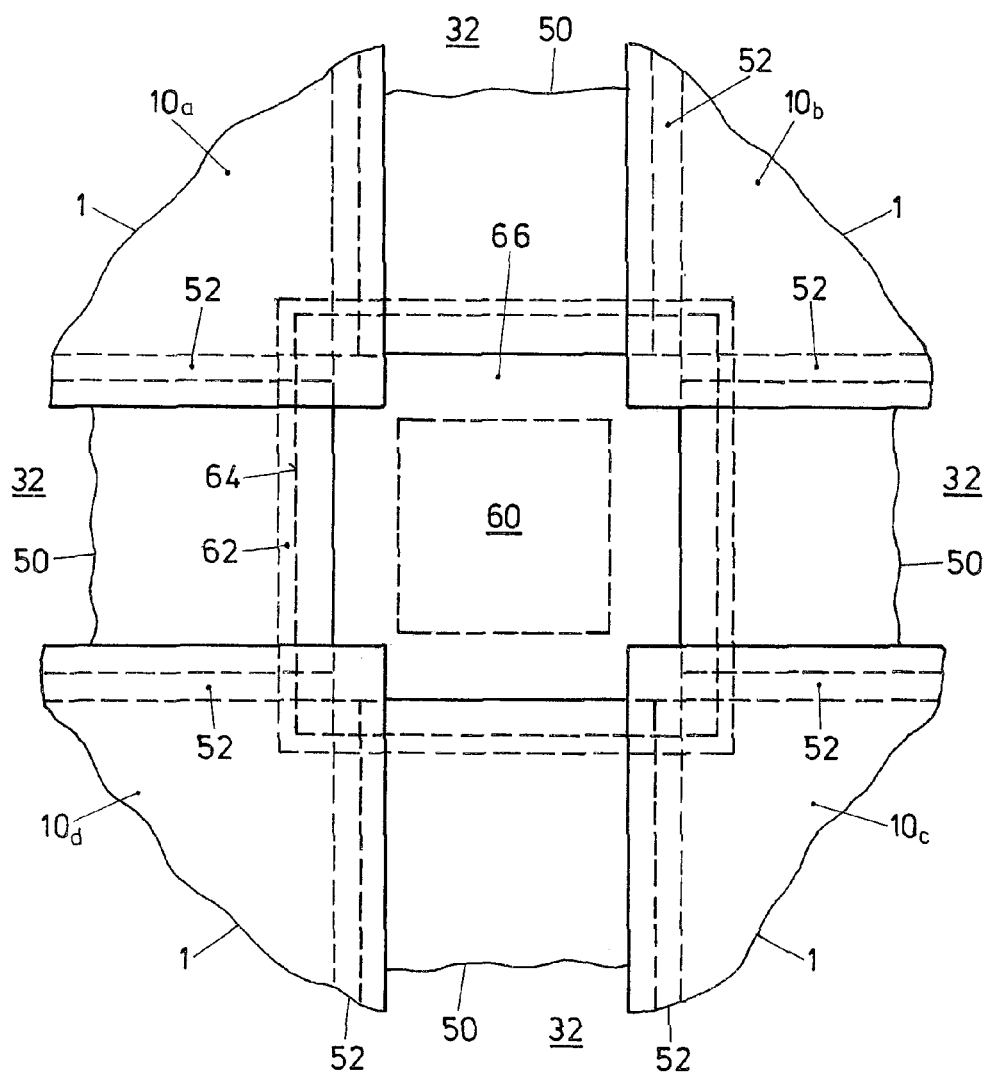

The figures of the first aspect show:

FIG. 1 simplified and schematically in a perspectivic view, an embodiment of a building construction surface element according to the invention;

FIG. 2 to 6 Simplified and schematically, different embodiments of spacers provided at a spacer arrangement in the building construction surface element as shown in FIG. 1;

FIG. 7 a cross-sectional representation of a part of an embodiment of a building construction according to the present invention comprising at least two of the building construction surface elements e.g. according to the FIG. 1 embodiment;

FIG. 8 a simplified cross-sectional representation of a part of a further embodiment of a building construction according to the present invention, which may be combined with the embodiment of FIG. 7;

FIG. 9 schematically and simplified, a top view on a building construction according to the invention with at least four building construction surface elements according to the invention.

Figure 10:
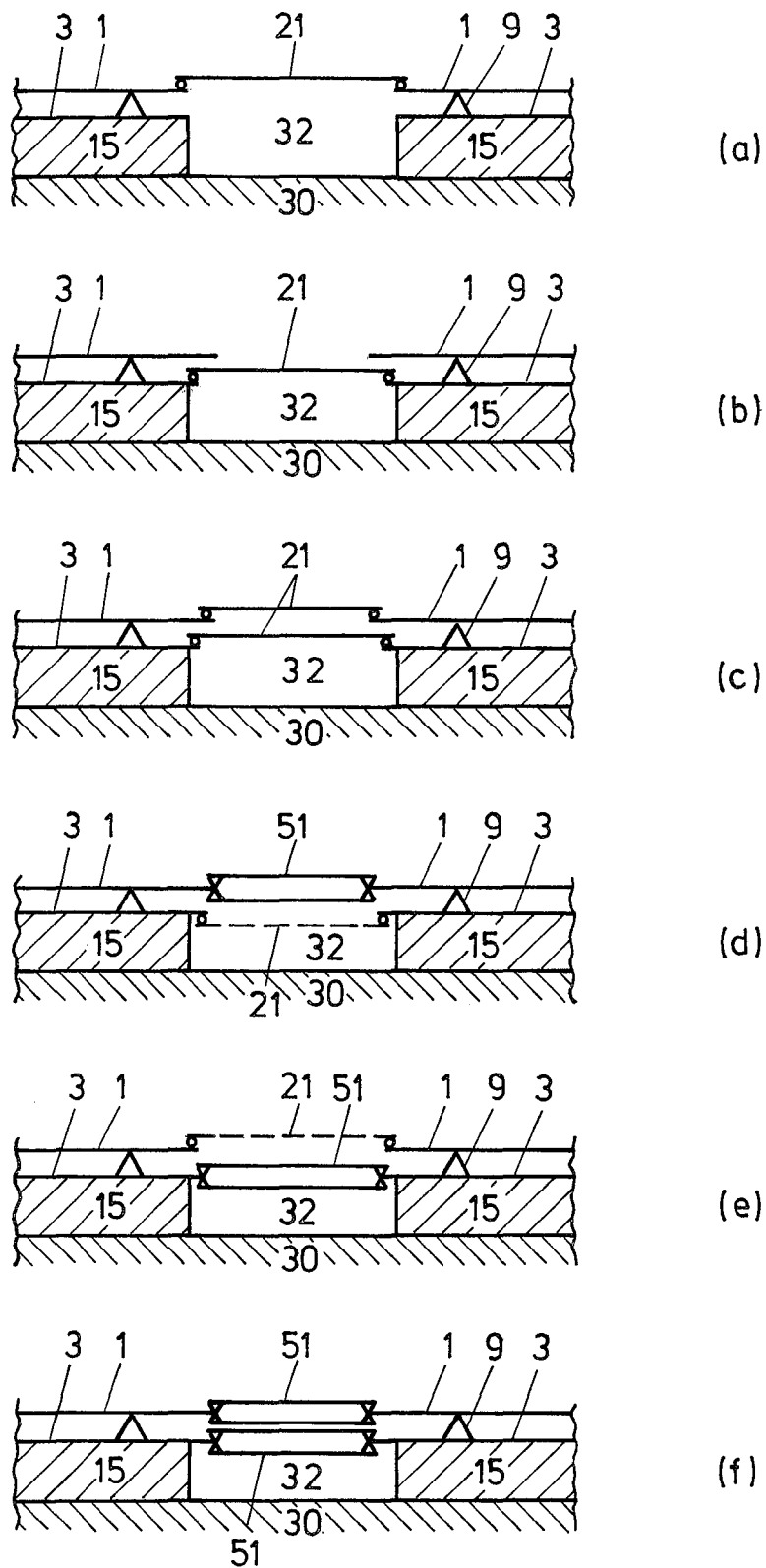

FIG. 10(*a*) to (*f*) most schematically and simplified, different variants of waterproof sealing a gap between two building construction surface elements according to the invention and of a building construction according to the invention.

Figure 11:
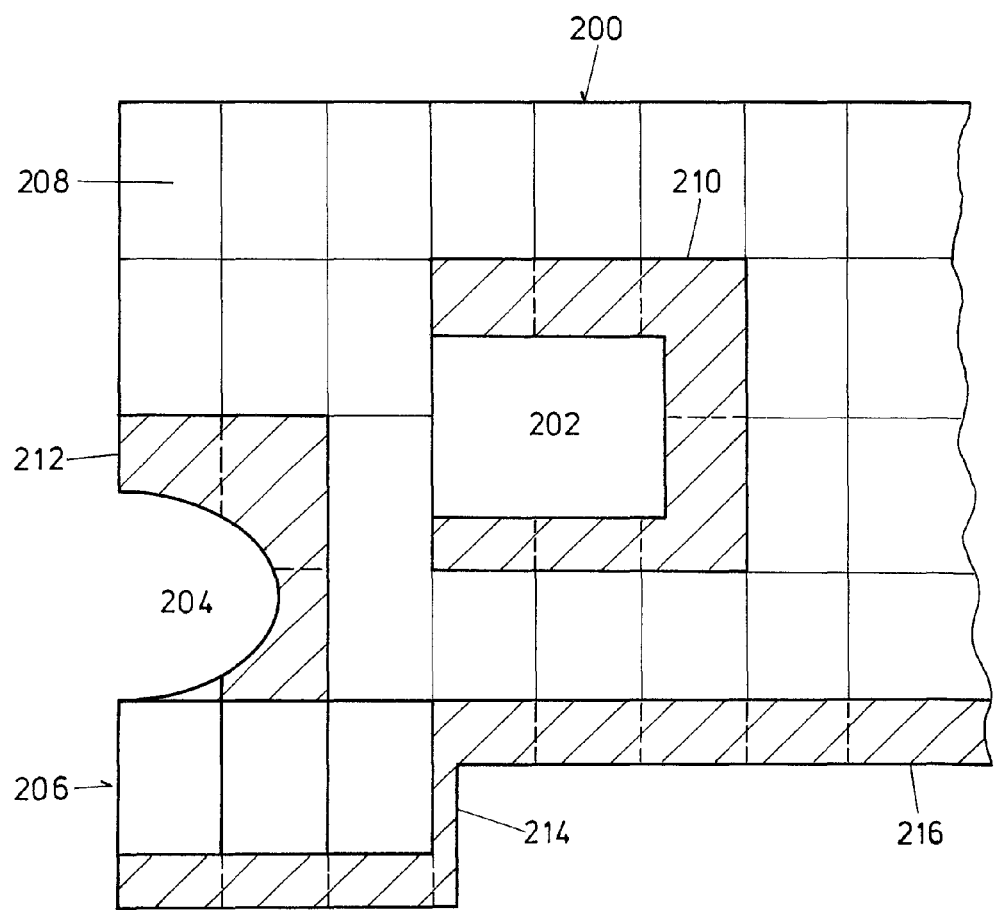
Figure 12:
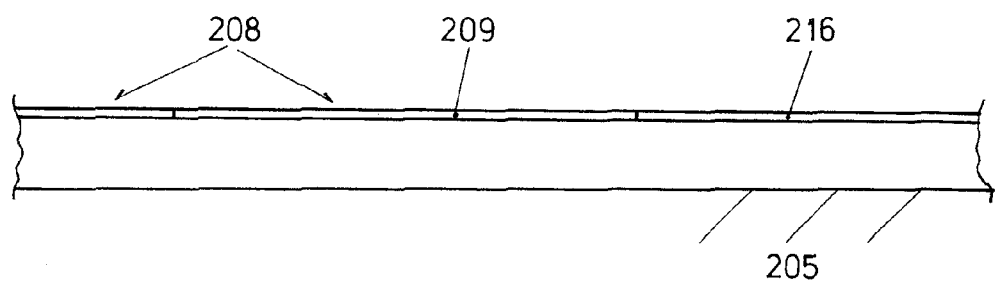
Figure 13:
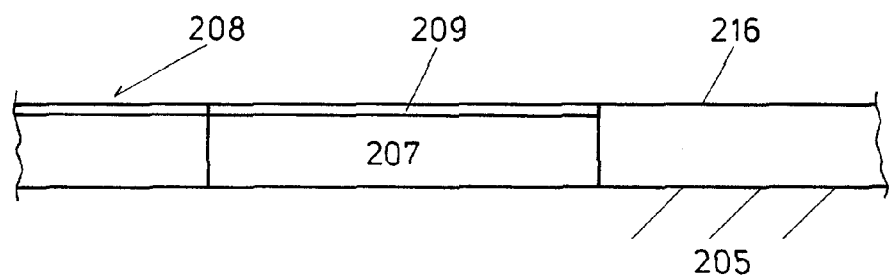
Figure 14:
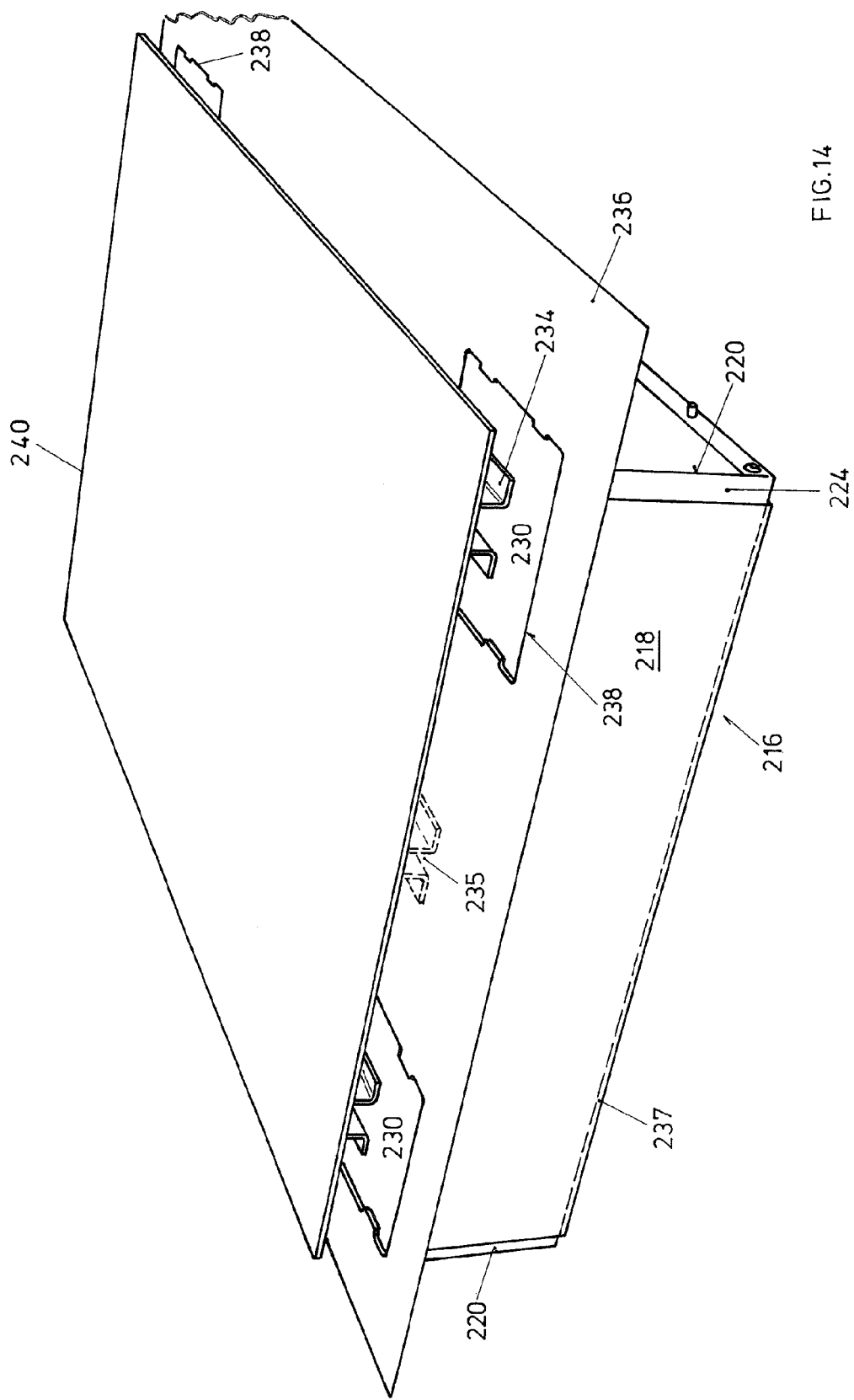
Figure 15:
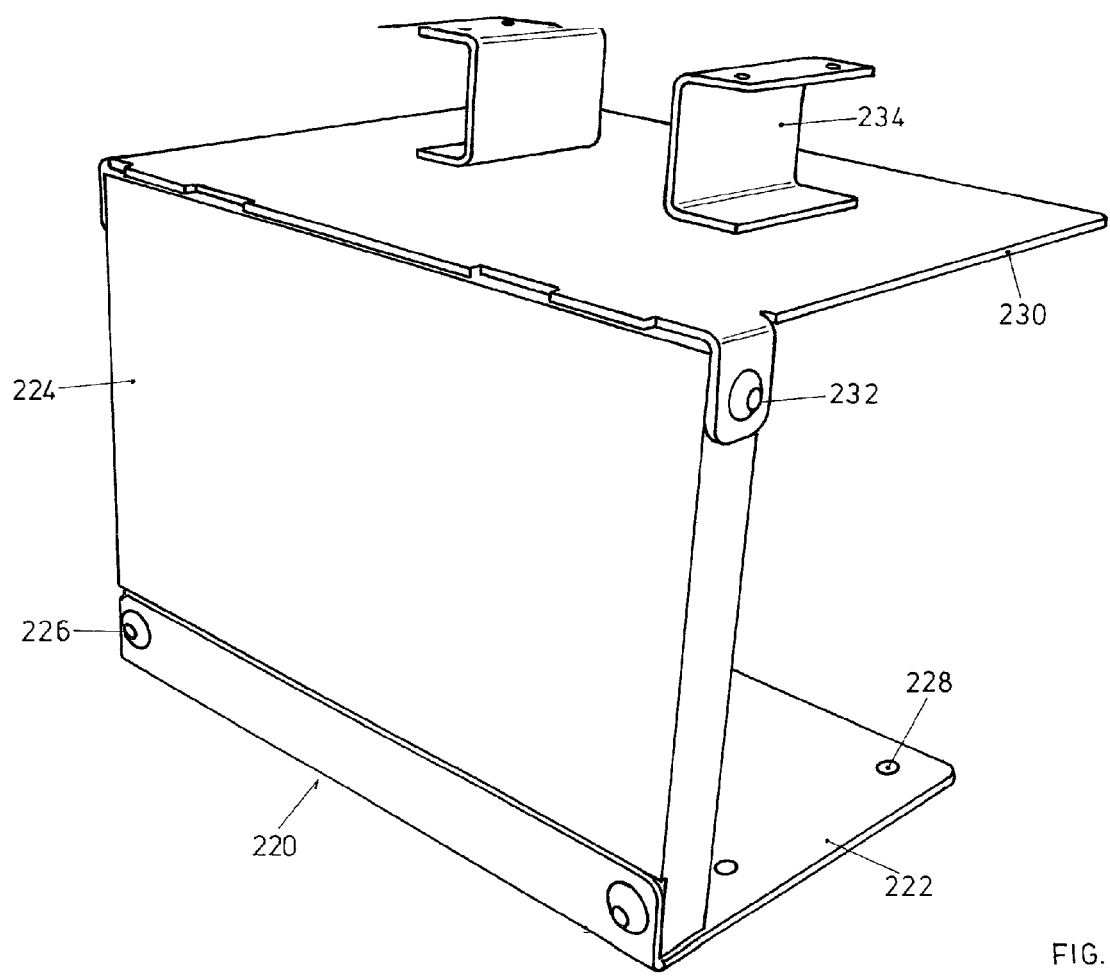
Figure 16:
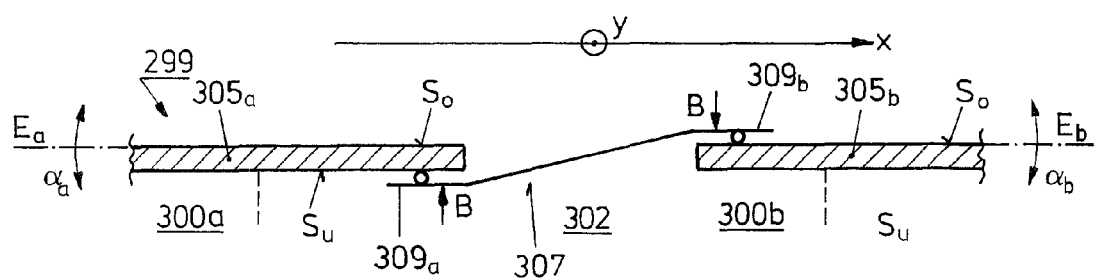
Figure 17:
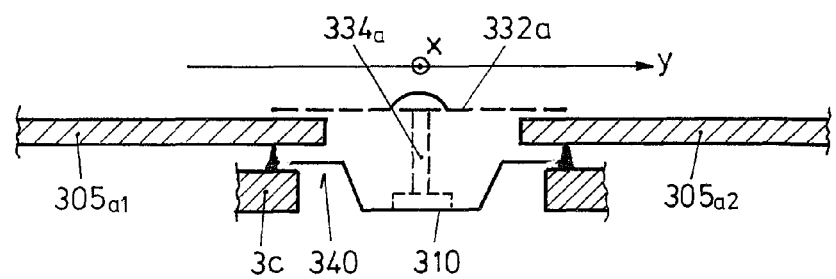
Figure 18:
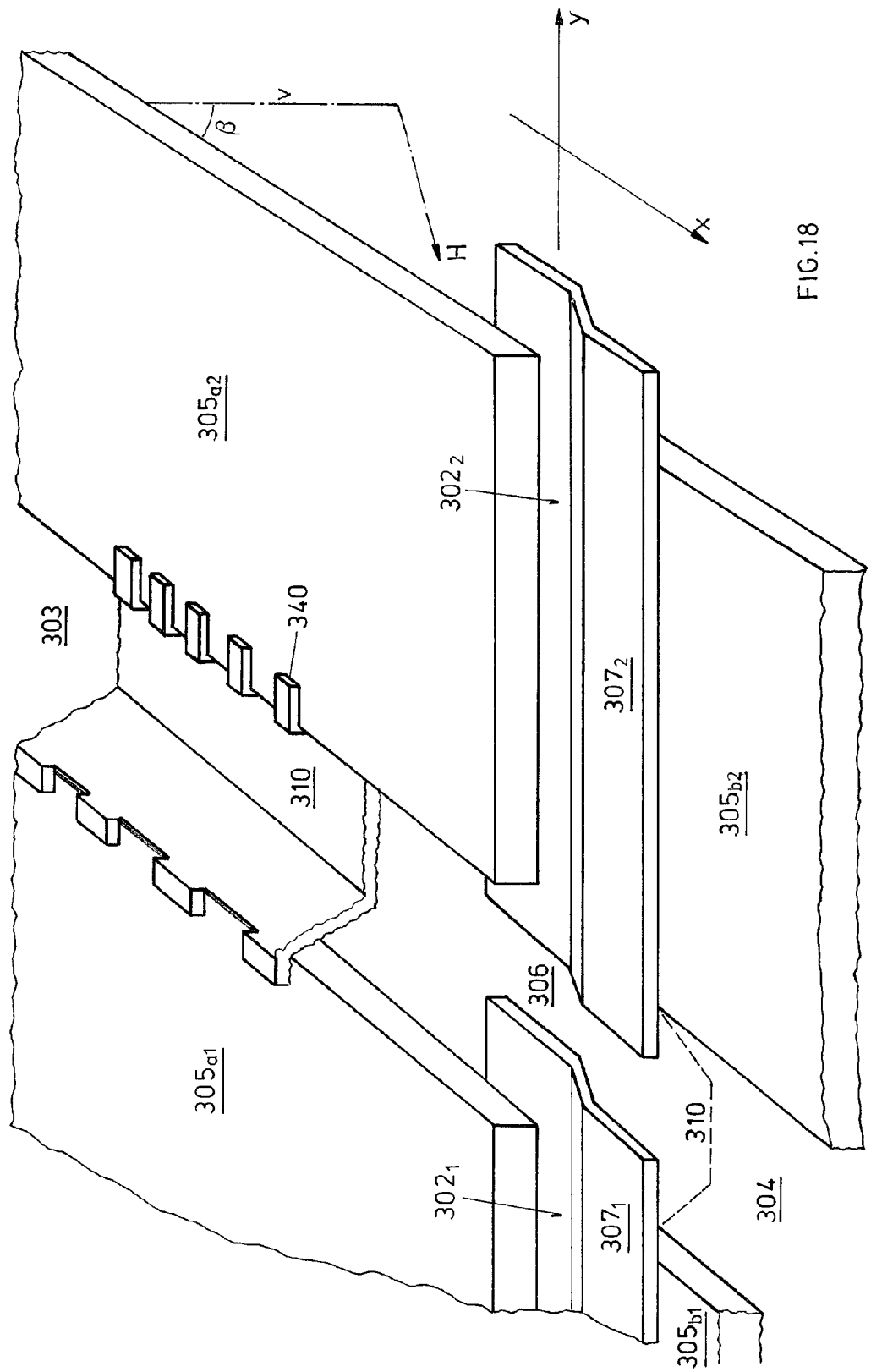

The figures under the second and combined aspects show:

FIG. 11: in a most simplified and schematic top view representation, a surface of a building construction covered by first and second building construction surface elements according to the invention under its second aspect;

FIG. 12: a most schematic and simplified cross-sectional representation of first and second construction surface elements according to the invention under its second aspect, wherein the first building construction surface elements are solar energy converter modules or panels;

FIG. 13: in a representation in analogy to that of FIG. 12, an embodiment of first and second building construction surface elements according to the invention under its second aspect, whereat the first building construction elements comprise solar converter modules as well as building construction elements;

FIG. 14: in a perspectivic view a second building construction surface element according to the invention under its second aspect and adapted to be combined with first building construction surface elements as of the first aspect of the invention and as exemplified e.g. in FIG. 7;

FIG. 15: in a perspectivic representation mounting members as flexibly provided along the periphery of a second building construction surface element as depicted in FIG. 14;

FIG. 16: most schematically, a cross-sectional representation of a further embodiment of bridging gaps between neighboring building construction surface elements by a mechanically biased sealing arrangement;

FIG. 17: in a schematic representation according to that of FIG. 16, a mechanically biased sealing arrangement bridging gaps between building construction surface elements which gaps are traverse to the gaps bridged according to FIG. 16;

FIG. 18: in a perspective representation, schematically, the cooperation of mechanically biased sealing arrangement along crossing gaps between building construction surface elements and conceived as schematically shown in the FIGS. 16 and 17;

FIG. 19: a cross-sectional representation of a today practiced embodiment of a mechanically biased sealing arrangement as principally described with the help of FIG. 16 and present in the embodiment according to FIG. 18, and FIG. 20: a today practiced embodiment of a mechanically biased sealing arrangement as schematically presented with the help of FIG. 17, also present in FIG. 18.

DESCRIPTION OF FIRST ASPECT BY EXAMPLES

FIG. 1 shows in a perspectivic view, schematically and simplified, one embodiment of a building construction surface element 10. A PV panel 1, which is shown in FIG. 1 transparent for purposes of seeing all the structures of the building construction surface element 10 beneath, has a surface $S_o$ to be exposed to solar light and a back surface $S_u$. Spaced from and parallel to the back surface $S_u$ of the PV panel 1 there is provided a mounting plate 3, which may e.g. be of a metal, in a good embodiment of today of aluminum, or of a plastic material or which may be of sandwiched layer material. Between the back surface $S_U$ of the PV panel 1 and a mounting surface $S_m$ of mounting plate 3 there is formed a venting interspace 7 extending substantially all along the back surface $S_u$ of the PV panel 1 and the mounting surface $S_m$ of the mounting plate 3. The PV panel 1 is mounted and fixed with respect to the mounting plate 3 by an arrangement of spacers 9. Thereby, in a good embodiment the back surface $S_u$ of the PV panel 1 is glued to the spacers 9 as shown by reference 11.

Figure 2:
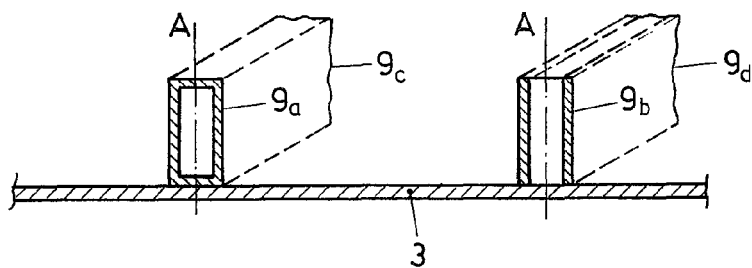

Different embodiments of spacers 9 are shown in the FIG. 2 to 6 schematically. The spacers according to FIG. 2 are distinct parts, either open or closed cylindrical studs $9_a$, $9_b$ about cylinder axes A or are linearly or bent distinct spacer bars as shown in dash lines at $9_c$ and $9_d$.

Clearly, instead of being cylindrical, the spacer studs $9_a$ and $9_b$ may be of quadratic or square cross-section or of any suitable cross-sectional shape.

Figure 3:
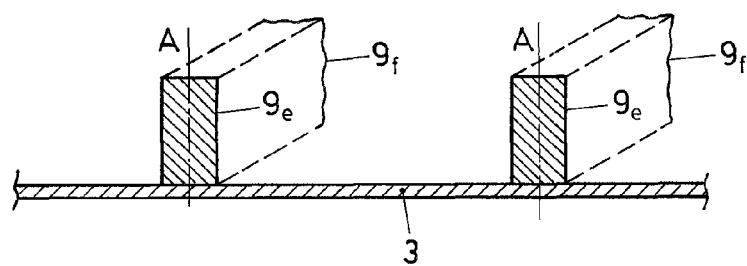

According to FIG. 3 and in opposition to the embodiments of FIG. 2 the spacers $9_e$ are of full material, e.g. cylindrical about axes A. Alternatively, these full material spacers may be provided as elongated linear or curved bars as shown at $9_f$ in dash line.

Figure 4:
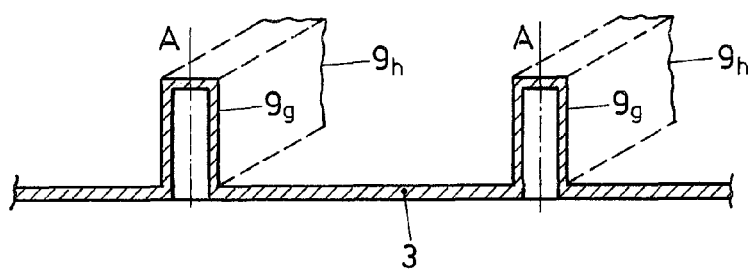
Figure 5:
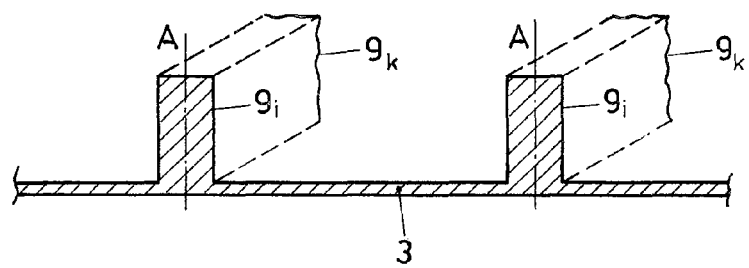
Figure 6:
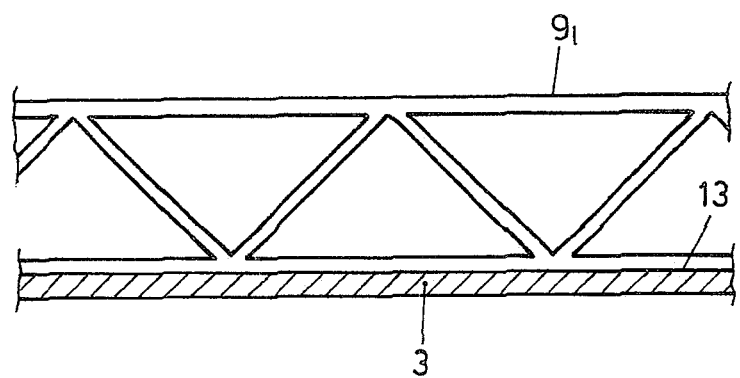

Whereas according to FIGS. 2 and 3 the spacers are provided as distinct, separate parts fixed to the mounting plate 3 as by gluing or soldering, the spacers according to the embodiments of FIGS. 4 and 5 are one part with mounting plate 3. According to FIG. 4 cylindrical spacers $9_g$ are formed out of mounting plate 3 as by stamping. Alternatively, such stamped out spacers may be linear or curved bar profiles as shown in FIG. 4 in dash lines at $9_h$. According to the embodiment of spacers of FIG. 5, cylindrical or otherwise cross-sectioned spacer studs $9_i$ are molded or cast on the mounting plate 3 or as well as linear or curved bars $9_k$ shown in dash line in FIG. 5. In the embodiment according to FIG. 6 instead or additionally to stud-shaped or bar-shaped spacers as were addressed in context with the FIGS. 2 to 5, at least a part of the spacers are framework bars as schematically shown at $9_l$ of FIG. 6. Such bars $9_l$ are e.g. soldered to the mounting plate 3 as shown at reference no. 13 in FIG. 6. Importantly, the spacers 9 do not substantially block or bar the venting interspace 7. By respectively providing and distributing spacers 9, one achieves additionally to maintaining a wide open venting interspace 7, an accurate support for the PV panel 1 most effectively e.g. by providing at least a part of the spacers 9 constructed as framework bars as schematically shown in FIG. 6.

Turning back to FIG. 1 there is provided a thermal insulation plate 15 which may be made of at least one of the following materials:

Polyurethane, PUR
Polyisocyanurate, PIR
Polyethylene terephthalate, PET
Rockwool
Expanded perlite,
Wood fibre
Insulating paint and may be conceived e.g. with honeycomb patterns, and which is fixed to the rear side $S_r$ of the mounting plate 3 as by gluing. Today it is preferred to provide in the thermal insulation plate at least a layer of rockwool or to make the thermal insulation plate 15 of rockwool.

The insulation plate 15 may be of one single material or may be realized in a sandwiched structure of different layers and materials. Thereby, the insulation plate may additionally to its object of providing for thermal insulation provide for acoustical insulation and/or provide for a high heat capacity which different objects might be realized by a single material or by applying specifically suited different materials.

It further may be advantageous for some applications to have a system of channels through and along the insulation plate 15 and flowing a cooling or a heating medium as e.g. water through such system of channels (not shown in FIG. 1). By such medium on one hand heat may be removed from the building construction surface element 10 if necessary as in summer, and heat may be applied, as in winter, to the addressed surface element for de-freezing the surfaces of the PV panel 1 exposed to solar light.

According to the embodiment of FIG. 1 the thermal insulation plate 15 is fixed opposite to mounting plate 3 to a further mounting plate 17 which may be of a metal or of plastic material and which is today realized in aluminum. Dependent on the material of the thermal insulation plate 15 it might be possible not to apply a further mounting plate 17. Especially in the case, where the thermal insulation plate 15 is made of or comprises a layer of rockwool, which material stands practically no tearing strength, a further mounting plate 17 has to be provided. The further mounting plate 17 may be solely glued to the thermal insulation plate 15 if such approach is possible in view of the material of the thermal insulation plate 15. Especially in that case where the thermal insulation plate 15 consists of or comprises a layer of rockwool, the further mounting plate 17 is mounted and biased to the mounting plate 3 by means of connection members as exemplified in FIG. 1 by tie bars 19. At least a part of the length extent of the tie bars 19 is made of thermally non-conductive material as of plastic material. Thereby, thermally conductive bridging of the thermal insulation plate 15 is avoided.

As shown in FIG. 1 at least a part of the peripheral edges of mounting plate 3 is provided with a waterproof membrane-band or -strip 21. A part of the width of membrane band 21 is sealingly fixed to the mounting surface $S_m$ of the mounting plate 3 as by gluing, whereas a second part of the width-extent of the waterproof membrane band or strip 21 freely overlaps the edge of mounting plate 3. According to the embodiment of FIG. 1 such waterproof band 21 is applied along one length-wise edge $3_l$ of mounting plate 3 and along one width-wise edge $3_w$ of the mounting plate 3.

The waterproof membrane band may thereby be of a rigid material or, and in a today preferred realization form, is of foil-like flexible material.

FIG. 7 shows a part of a building construction according to the present invention in cross-sectional and simplified representation. In this representation additionally some details of an embodiment of the building construction surface element as was principally described in context with FIG. 1 will become evident.

The building construction comprises at least two building construction surface elements $10_a$ and $10_b$ and a remaining building construction 30, the surface thereof being completed and finished by the addressed at least two building construction surface elements $10_a$ and $10_b$.

According to FIG. 7 the two building constructions surface elements $10_a$ and $10_b$ are mounted on the remaining building construction 30 side by side and defining in between a gap 32. The two respective PV panels 1 are mutually spaced and are respectively fixed as by gluing to the respective spacers 9. The mounting plates 3 of the two building construction surface elements $10_a$ and $10_b$ are mutually spaced. Their parallel edges are substantially flush with the PV panels 1. The respective thermal insulation plates 15 are applied between the mounting plate 3 and further mounting plates 17. The further mounting plates 17 project into the gap 32 with respect to the edges of mounting plates 3 and the side surfaces of thermal insulating plates 15 and commonly bridge the bottom of gap 32. As shown in dash line at 34 these projecting parts of the further mounting plate 17 are exploited for fixating the building construction surface elements $10_a$ and $10_b$, as by screws, to the remaining building construction to be finished with respect to its surface by the addressed surface elements $10_a$ and $10_b$.

As further shown in FIG. 7 the left-hand building construction surface element $10_a$ is provided with the waterproof membrane band or strip 21 as of FIG. 1. The freely overhanging part of the membrane band or strip 21 is applied to bridge the upper end of gap 32 and is sealingly fixed, e.g. by gluing, schematically shown at 36, to the right-hand building construction surface element $10_b$ on the mounting surface of mounting plate 3. Thereby, a waterproof seal towards gap 32 and the remaining building construction 30 is established. As shown in dash line and making use of one waterproof membrane band 21 at one of the two building constructions surface elements or making use of a waterproof membrane band along both respective edges of the mounting plates 3 of both building construction surface elements $10_a$ and $10_b$, the bridging of gap 32 by one or two bands 21 may be made to define for a channel-like groove 38 for collecting and removing water.

As further shown in FIG. 7, prior to sealingly closing the upper end of gap 32, a thermally insulating inlay 40 may be applied, as shown by arrow W, into the gap 32 before sealingly closing the gap 32 by means of one of or two of the addressed waterproof membrane bands or strips 21.

The membrane bands 21 as of FIG. 1 or FIG. 7 or any of the subsequent FIGS. addressing such band may also be realized by a respective layer covering their support surfaces completely and projecting as the addressed band over the respective edges. Thus and with an eye on FIG. 1 in some cases the band 21 may be realized by completely covering the mounting surface $S_m$ of the mounting plate with a respective layer which at the edges forms the bands 21.

The space between the photovoltaic solar panels 1 and mounting plate 3 may be exploited for cables as for electric cables for connecting the PV panels 1.

Departing from a representation according to FIG. 7 FIG. 8 shows an alternative or additional solution of sealingly closing the gap 32. In the embodiment of FIG. 8 parts already addressed in context with FIG. 7 are referenced with the same reference numbers.

According to the embodiment of FIG. 8 there is provided an elongated bridging plate 50 which extends substantially all along gap 32 and overlaps the back surfaces of the PV panels 1. Between the back surfaces $S_u$ of the solar panels 1 and the elongated bridging plate 50 there is provided, respectively, an elongated sealing member 52 also extending along the extent of gap 32. Resting and overlapping of the parallel edges of the surfaces $S_o$ to be exposed to solar light of the PV panels 1 there is provided at least one biasing member 54. The elongated bridging plate 50 and the biasing member 54 are mutually biased by means of at least one tensioning bar 56, according to the embodiment of FIG. 8 a screw-tensioning bar. By mutually biasing the elongated bridging plate 50 and the at least one biasing member 54 the pair of elongated sealing members 52 is sealingly biased between the back surfaces $S_u$ and the elongated bridging plate 50. Thus, the biasing member 54, the elongated bridging plate 50 and the elongated sealing members 52 form a "mechanically biased sealing arrangement" 51.

As shown in dash line additionally to the waterproof gap sealing by means of the sealing arrangement 50, 52, 54 and 56 a second waterproof sealing may be established as was explained in context with FIG. 7 by means of the one or the two waterproof membrane bands 21.

With an eye on sealingly joining the parallel edges of the PV panels 1 it may be seen that elongated sealing members 52 might additionally or alternatively be provided between the edges of the surfaces $S_o$ of the PV panels 1, to be exposed to solar light, and the biasing member 54 which, in this case, is to be constructed as an elongated bridging plate all along the extent of gap 32. That element of element 54 and element 50 which in any case cooperates with elongated sealing members has to be elongated as well along the extent of gap 32. If only one of the two elements 54 and 50 cooperates with a pair of elongated sealing members as of 52, then the other of these two members may be constructed just as one or more than one biasing plates. Thus e.g. the element 54 of FIG. 8 may be one or more than one biasing plates which are distributed along the length extent of the elongated bridging plate 50 of FIG. 8.

FIG. 9 shows a top view according to arrow P of FIG. 8 upon a building construction according to the invention which comprises four surface elements $10_a$ to $10_d$ finishing the surface of the building construction. The four building construction surface elements $10_a$ to $10_d$ are mounted side by side, thus forming a cross of gaps 32 with a cross-central area 60. The four gaps 32 are each provided with an elongated bridging plate 50 biasing respectively a pair of elongated sealing member 52 towards the back surface of the respective PV panels 1.

In FIG. 9 and for clearness sake the biasing members 54 as have been discussed in context with FIG. 8 are not shown.

For sealingly closing the cross-center area 60 there is provided a cross-center sealing arrangement 62 which comprises a cross-center covering plate 64, which overlaps the four neighboring corners of the PV panels 1 as well as the respective ends of the elongated bridging plates 50 and the ends of the respective pairs of elongated sealing members 52. The cross-center covering plate 64 is placed along the back surfaces of the PV panels 1 and, as addressed, overlapping the ends of the four elongated bridging plates 50. Along the cross-center covering plate 64 and adjacent its periphery, there is provided a looping seal member 66, which rests on one hand against the lower edge surfaces of the elongated bridging plates 50 and on the other hand along the ends of all four pairs of elongated sealing members 52. As not shown in FIG. 9 for clearness sake, the cross-center covering plate 64 is biased upwards by means of a biasing member resting against the surfaces $S_o$ of the PV panels 1, which are to be exposed to sun light and in their respective neighboring corner areas. Such biasing member is connected to the cross-center covering plate 64, in analogy to biasing member 54, e.g. by one or more than one tie-rod, preferably screw-rod.

With an eye on the techniques of waterproof sealing a gap between two adjacent building construction surface elements of a building construction according to the invention a first technique has been exemplified in FIG. 7, namely of providing a gap-bridging membrane band between neighboring construction surface elements. A second technique has been exemplified with the help of FIG. 8, namely of providing between neighboring building construction surface elements a mechanically biased sealing arrangement 51. It has been stated that these two techniques may advantageously be combined. FIG. 10(*a*) up to (*f*) show different variants of waterproof sealingly closing the addressed gap 32, either by membrane band technique or by providing a mechanically biased seal arrangement or by combining both techniques.

According to FIG. 10(*a*) the gap 32 is waterproof sealed by one or two membrane bands 21 bridging the parallel edges of the PV panels 1.

According to 10(*b*) the gap 32 is waterproof bridged by one or two membrane bands 21 bridging the parallel edges of the mounting plates 3.

According to 10(*c*) the gap 32 is waterproof sealed on one hand by one or two membrane bands 21 bridging the parallel edges of the PV panels 1 and on the other hand by one or two membrane bands 21 bridging the parallel edges of the mounting plates 3.

According to 10(*d*) the gap 32 is waterproof sealed by a mechanically biased seal arrangement 51 between the parallel edges of the PV panels 1. Additionally and as shown in dash lines the gap may be waterproof sealed by one or two membrane bands 21 bridging the parallel edges of the mounting plates 3.

According to FIG. 10(*e*) the gap 32 is waterproof sealed by a mechanically biased seal arrangement 51 bridging the parallel edges of the mounting plate 3. As shown in dash lines additionally the gap may be waterproof sealed by one or two membrane bands 21 between the parallel edges of the PV panels 1.

According to FIG. 10(*f*) the gap 32 is waterproof sealed by a first mechanically biased seal arrangement 51 bridging the parallel edges of the mounting plates 3 and by a second mechanically biased seal arrangement 51 bridging the parallel edges of the PV panels 1.

Description of Second Aspect and of Combined First and Second Aspects by Examples FIG. 11 shows in a top view an example of a surface of a building construction of a randomly selected shape to explain the present invention under the generic approach according to the second aspect thereof. The surface 200 of the building construction comprises e.g. an opening 202 for a window or for a chimney, a bent, arching border portion 204 as well as a projecting portion 206. The predominant area of surface 200 is covered by first building construction surface elements 208, which are all of equal dimensions and shapes, e.g. of standardized dimensions and shapes as industrially manufactured. The first building construction surface elements 208 comprise or consist of solar energy converter modules.

Nevertheless, it is absolutely possible to provide the addressed first building construction surface elements with the respective solar energy converters not only in one pre-established shape and dimension, but in two or more predetermined dimensions and shapes as industrially manufactured. Irrespective, whether the pattern of first building construction surface elements is realized by means of a single predetermined dimension and shape of such elements or by more than one, there remain as schematically shown in FIG. 11 surface areas of surface 200 which may not be covered by the addressed first building construction surface elements 208 of industrially manufactured, practically standardized dimensions and shapes.

In FIG. 11 most schematically and departing from a single predetermined dimension and shape of the first building construction surface elements 208, those areas which may not be covered by the addressed first building constructions surface elements are cross-hatched, the areas 210, 212 and 214.

For covering these areas 210 to 214 construction surface elements must be appropriately and adaptively shaped and dimensioned. Thus, these areas are covered by a respective number of second building construction surface elements 216. Because provision of a solar converter module at each of the first building construction surface elements 208 prevents appropriate and adaptive shaping as to be performed most advantageously directly on the place of constructing the overall building construction with a surface 200, the second building construction surface elements 216 do not comprise a solar converter module, which is the predominant part of such elements preventing flexible and on-the-spot tailoring.

Thus, the second building construction surface elements 216 are constructed in a manner which allows flexible and adaptive shaping on the spot of construction of the building construction, be it by cutting, sawing, etc. They do not comprise solar converter modules, but their surfaces according to the solar converter module surfaces of first building construction surface elements 208 are visually adapted to the visual appearance of the addressed surfaces of first building construction surface elements 208, so that the overall covered area of surface 200 becomes visually homogeneous. E.g. if the addressed surfaces of the first building construction surface elements are patterned, e.g. due to visibility of solar cells, if the respective solar energy converters are PV converters, then the respective surfaces of the second building construction surface elements 216 may be provided with a respective equally patterned design. Thus, the addressed second building construction surface elements 216 are in fact "fakes" or "dummies" of the first building construction surface elements 208, only latter ones being solar energy converters or comprising solar energy converters.

As shown in FIG. 12 most schematically and simplified, the first building construction surface elements 208 may be realized by means of solar energy converters. According to the embodiment of FIG. 13 in a representation in analogy to that of FIG. 12 the first building construction surface elements 208 comprise, facing the surrounding wherefrom solar energy impinges, S, solar energy converters as well as building construction elements 207 which provide for the finishing of the building construction. The building construction basis is schematically shown by reference number 205 in both FIGS. 12 and 13.

The second building construction surface element 216 may be differently constructed for the embodiment of FIG. 12 and for the embodiment of FIG. 13. In the embodiment of FIG. 12 it has just the function of completing the area of surface 200 (FIG. 11) to be covered and visually simulating the surface of solar energy converters 209. In the embodiment of FIG. 13 the second building construction surface elements 216 on one hand simulate the visual surface appearance of the solar energy converters 209 being part of the first building construction surface elements 208 and additionally provide for the same building construction element function or characteristics as do the building construction elements 207 of the first building construction surface elements 208 in this FIG. 13 embodiment.

In a today preferred and realized embodiment of the generic approach according to the second aspect of the invention and as generically has been explained with the help of FIG. 11 to 13 the first building construction surface elements 208 are constructed as was explained in context with the building construction surface elements of the first aspect of the present invention, thus, as examples, in context with the FIGS. 1 to 10. In the following an example of the invention under the second aspect combined with first building construction surface elements as of the first aspect of the present invention shall be described in more details. Thereby, the second building construction surface elements as of 216 of generic FIG. 11 are adapted to the construction of the first building construction surface element under the first aspect of the invention so as to optimally be combined with the addressed first building construction surface elements when performing covering of a respective building construction surface.

FIG. 14 shows a second building construction surface element 216 which is adapted to the construction of first building construction surface elements as of the present invention under its first aspect.

The "fake" or "dummy" second building construction surface element 216 comprises a relatively thick layer arrangement 218. The layer arrangement may comprise one or more than one layer. Preferably at least one layer of the layer arrangement 218 is of a thermally insulating material. In the example of FIG. 14 the layer arrangement, also called the plate 218 is preferably of thermally insulating material. Equally to the first building construction surface element as disclosed in context with the first aspect of the present invention, this thermal insulation plate 218 may be of one or more than one of the following materials:

Polyurethane, PUR;
Polyisocyanurate, PIR;
Polyethylene terephthalate, PET;
Rockwool;
Wood fibre
Expanded perlite;
Insulating paint.

The insulating plate 218 is clamped along its periphery by fixating members 220, an embodiment thereof being shown in a perspective view in FIG. 15. Generically, the fixating member 220 is a U profile.

A bottom leg 222 is mounted to the basis leg 224 detachably and as shown in FIG. 15 by screws 226. The bottom leg 222 may be fixed to the building construction to be covered as by screws (not shown) through holes 228. The upper leg 230 is mounted to the basis leg 224 of the U profile as by screws 232. Spacers 234 are fixed to the outer surface of the upper leg 230. These spacers 234 may be constructed in analogy to spacers 9 amply discussed in context with the first building construction surface element under the first aspect of the present invention, exemplified by the FIGS. 1 to 10 and the respective description.

The spacers 234 are, if manufactured as distinct parts, e.g. screwed, welded or glued to the addressed outer surface of upper leg 230.

The insulation plate 218 of FIG. 14 is thus clamped within the U profile of mounting members 220, whereby the bottom legs 222 are first mounted to the building construction to be covered and then the U profile of the support members 220 is completed with insulation plate 218 clamped or deposited therein. If necessary, the insulation plate 218 is firmly fixed to the mounting members 220 as by gluing, screwing, etc.

Because the second building construction surface element, an example of which being shown in FIG. 14, has to be adaptively shapeable on the construction spot, it becomes clear that the addressed support members 220 may flexibly be applied to any resulting bordering contour surface of insulation plate 218, once latter has been appropriately tailored.

Back to the embodiment as shown in FIG. 14: Especially if the embodiment of the first building construction surface elements accords with that embodiment under the first aspect of the present invention as shown and respectively described in context with FIG. 7, there is provided on top of insulation plate 218 a waterproof membrane or foil 236, wherein cutouts 238 have been cut to pass the spacers 234 therethrough.

So as, if at all necessary, properly support an extended PV module fake plate 240 and as shown in dash lines in FIG. 14, spacers 235 may be provided along the backside of the PV module fake plate 240 additionally to the spacers 234. Such spacers 235 are provided between the topside of the waterproof membrane or foil 236 and the backside of fake plate 240.

In some applications of the "fake" or "dummy" second building construction surface element 216, e.g. dependent upon the material or materials of the insulating plate 218 and/or upon the construction of the building construction basis as referenced by 205 in the FIGS. 12 and 13, it might be advisable or even necessary to provide on the rear side of insulating plate 218 a more or less rigid support plate, e.g. of a plastic material or of a metal, thereby of aluminum, which includes obviously an aluminum alloy. Such a support plate is shown in dash line in FIG. 14 at 237. If such a support plate 237 is provided, then (not shown) it is absolutely possible to provide compression support of PV module fake plate 240 by distance holders between the backside of fake plate 240 and the top side of such a plate 237, thus possibly traversing the insulation plate 218. In this case care should be taken not to significantly spoil the insulation characteristics of insulation plate 218, which is e.g. realized by establishing such supports bridging the insulation plate 218 of thermally insulating material as e.g. of a plastic material.

Further (not shown) it might also be necessary or at least advisable for some applications as with respect to the material of the insulation plate 218 to provide instead of a waterproof membrane or foil 236 or additionally thereto a rigid material plate as of a plastic material or of a metal at the top of insulation plate 218.

Where adjoining a first building construction surface element as shown in FIG. 7 and generically according to first building construction surface element 208 as of FIG. 11, the waterproof membrane or foil 236 is made overlapping the insulation plate 218 so as to be linked in a waterproof manner to respective waterproof membrane bands or stripes 21 as shown in FIG. 7. Upon the spacers 234 there is mounted a PV module fake plate 240 which, with respect to visual appearance, looks like the surface of a PV module as of PV modules 1 of FIG. 7.

The PV panel or module fake plate 240 is in a today practiced example of aluminum, more specifically of an aluminum alloy. Its surface exposed to the surrounding wherefrom solar light impinges is treated to become visually as similar as possible to the respective surface of the PV modules applied to the first building construction surface elements 208 of FIG. 11 and respectively according to the embodiment depicted in FIG. 7 of that first building construction surface element.

The PV module or panel "fake" plate 240 may as well be adaptively tailored on the location of construction of the building construction to be covered as by cutting or sawing. It is mounted to the supports 234 e.g. by gluing, by screwing, by rivetting or even by welding.

Second building construction surface elements as shown in FIG. 14 are joint to such second building construction surface elements 240 as has been described with respect to the first building construction surface elements according to the first aspect of the invention and as shown e.g. in FIG. 8. Equally, the second building construction surface elements 240 are joint to neighboring first building construction surface elements also as has been described with respect to neighboring first building construction surface elements of the first aspect of the invention and as specifically shown and described in context and in FIG. 8.

After having covered the surface 200 of the building construction on one hand with the addressed first building construction surface elements, generically shown in FIG. 11 by reference number 208, and second building construction surface elements, as generically shown in FIG. 11 at 216— as an example by first building construction surface elements according to FIG. 7 and second building construction surface elements according to FIG. 14—there may remain at the circumference of the surface 200 a border area of building construction surface elements to be completed. As the skilled artisan will easily recognize, this is performed by an arrangement of elongated closing members, e.g. of plastic material and/or metal material, which especially assure ventilation of the interspace between PV "fake" plate 240 and waterproof membrane or foil 236 and then continuously into interspace between PV module 1 and mounting plate 3 of the first building construction surface elements as shown in FIG. 7.

Due to the fact that the second building construction surface elements as applied according to the present invention under the second aspect do not comprise solar energy converters, but as a fake or dummy do visually appear like being provided with such solar energy converter as has been exemplified by the second building construction surface element of FIG. 14, mounting members may easily be applied to such second building construction surface elements e.g. snow stopper elements, safety devices to allow safe maintenance on the roof, or further elements to be added to the overall surface, as neither gluing nor drilling holes in the PV module "fake" plate poses any problems.

In context with the FIGS. 8 to 10 we have described the approach of bridging gaps between neighboring building construction surface elements in a watertight manner by means of mechanically biased sealing arrangements. In context with FIG. 7 we have addressed an approach of watertightly bridging such gaps by means of membrane bands. Both approaches, i.e. bridging the addressed gaps by mechanically biased sealing arrangements and of bridging such gaps by means of membrane bands, may be combined to improve if necessary water tightness.

By means of the FIGS. 16 to 20 a further approach of bridging the gaps between adjacent building construction surface elements shall be described which latter one as well may be combined with the approach of bridging such gaps by means of membrane bands, if water tightness is to be further improved.

The technique of bridging gaps between adjacent building construction surface elements as to be described in the following addresses bridging such gaps between construction surface elements with a photovoltaic solar PV panel, but not necessarily, although most advantageously constructed according to the building construction surface element of the present invention.

In FIG. 16 most schematically the technique of bridging the gaps between building construction surface elements 300a and 300b shall be explained. Both building construction surface elements 300a and 300b define for the gap 302 and comprise, as an outermost element, a photovoltaic solar PV panel $305_a$ and $305_b$ respectively. In a good embodiment and as was already addressed, the overall building construction surface elements $300_a$ and $300_b$ are constructed ad was described with the help of the FIGS. 1 to 7, i.e. according to the building construction surface elements of the present invention.

Each of the PV panels $305_a$ and $305_b$ defines for an outermost surface $S_o$ to be exposed to solar light and a back surface $S_u$. The mechanically biased sealing arrangement generically addressed with the reference number 307, is substantially plate-shaped and elongated in the direction y as indicated in FIG. 16, comprises a first extended edge portion $309_a$ as well as a second extended edge portion $309_b$.

The first edge portion $309_a$ extended in y-direction overlaps the PV panel $305_a$ along its back surface $S_u$, whereas the second extended edge portion $309_b$, extended in y direction, overlaps the PV panel $305_b$ along its surface $S_o$ to be exposed to solar light.

As schematically shown by the arrows B both extended edge portions $309_a$ and $209_b$ or only one thereof are biased towards the respective surface at least to an extent to just hold the overall assembly firmly together.

As becomes apparent from FIG. 16 the generic approach of bridging the gap 302 is to provide an imbricated mutual positioning of neighboring PV panels $305_a$ and $305_b$ and of the mechanically biased sealing arrangements 307. Whereas according to FIG. 16 the two PV panels $305_a$ and $305_b$ are shown each arranged along a plane $E_a$ and $E_b$ respectively and, according to FIG. 16, these planes form one common plane, the PV panels $305_a$ and $305_b$ and thus the respective building construction surface element $300_a$ and $300_b$ may be positioned practically at any desired angle $\alpha_a$ and $\alpha_b$ as schematically shown in FIG. 16. These planes may be parallel and mutually distant or may even mutually intersect. The bridging mechanically biased sealing arrangement 307 is suitably shaped, thereby maintaining both elongated edge areas respectively positioned to the PV panel $305_a$ and $305_b$ as was described.

Clearly, if e.g. the building construction 299 as realized by the addressed building construction surface elements $300_a$ and $300_b$ as well as by the mechanically biased sealing arrangement 307 is inclined with respect to vertical direction, then the first extended edge portion $309_a$ is realized at that PV panel $305_a$ which resides on a higher level. Thereby, water on the surface $S_o$ of PV panel $305_a$ is prevented to penetrate towards the remaining parts of the building construction surface element $300_a$, as towards an insulation plate 15 of the embodiment according to FIG. 1 and towards the building beneath such surface element. In analogy water received upon the mechanically biased sealing arrangement 307 is barred from penetrating, at the building construction surface element $300_b$, which resides on a lower level, towards and into the building, whereupon the addressed building construction surface element $300_b$ is mounted.

FIG. 18 shows in a perspective view and still schematically a building construction according to FIG. 17. Four building construction surface elements define for a cross of gaps. PV panel $305_{a1}$ and $305_{b1}$ are separated by gap $302_1$, which is bridged by the mechanically biased sealing arrangement or member $307_1$ as was described with the help of FIG. 16.

Equally, PV panel $305_{a2}$ and $305_{b2}$ are separated by gap $302_2$, which latter is bridged by the mechanically biased sealing arrangement $307_2$. The two mutually aligned gaps $302_1$ and $302_2$ are shown as extended in y direction equally to such extent in FIG. 16.

In the at least four building construction surface element patterns as shown in FIG. 18 PV panels $305_{a1}$ and $305_{a2}$ on one hand as well as PV panels $305_{b1}$ and $305_{b2}$ on the other hand are respectively separated from each other by gaps 303 and 304, which are mutually aligned and extend in x direction.

The mechanically biased sealing arrangements $307_1$ and $307_2$ must be mutually joined as not of infinite extent in y direction. This is done in the area 306, whereat the aligned gaps $302_1/302_2$ and 303/304 cross. This crossing area 306 might be critical with respect to water penetrating towards the remaining members of the building construction surface element and finally towards the building, whereupon the building construction with the pattern of building construction surface elements is applied to. For this object and additionally to bridge the gaps 303 and 304 extending in x direction there is provided a water collection channel arrangement 310 all along the gaps 303 and 304 and bridging the area 306, the gap crossing area. Any water penetrating through the joint area of the members $307_1$ and $307_2$ is collected in the addressed water collecting channel arrangement 310.

As shown in FIG. 18 the approach of imbricated PV panels and mechanically biased sealing arrangements is especially suited when the overall building construction is inclined with respect to vertical direction v as addressed in FIG. 18 by the angle β. Then the y direction is made substantially horizontal so that the PV panels $305_{a1}$ and $305_{a2}$ are positioned uphill with respect to the PV panels $305_{b1}$ and $305_{b2}$.

The water collection channel arrangement 310 bridging the gaps which extend in x direction does also prevent water to penetrate through the gaps 303 and 304 towards the building. As schematically shown in FIG. 18 the water collection channel arrangement 310 which runs continuously across area 306 may be mounted or suspended to the respective building construction surface elements 340 by hook-like members. Although for clearness' sake FIG. 16 shows the water collection channel arrangement 310 hooked to the PV panels it is preferred to provide such hooking suspension of the channel arrangement 310 to members of the building construction surface element below or under the PV panel, but above elements or members of the building construction surface elements which are not to be contacted by water as e.g. the isolation plate 15 in the embodiment of FIG. 1. The arrangement 310 may be hooked to mounting plate 3 of an embodiment shown in FIG. 1

Having described principally and with the help of schematic drawings the principle of the here addressed gap bridging, FIGS. 19 and 20 respectively show cross-sections of mechanically biased sealing arrangements on one hand according to 307 of FIG. 18, on the other hand of 310 of FIG. 18.

According to FIG. 19 the mechanically biased sealing arrangement 307 as of FIG. 18 comprises a bridging plate 315 preferably of a metal as of aluminum. The extended plate 315 has the first end portion $309_a$ as well as the second end portion $309_b$ as were explained in context with FIGS. 16 and 18. Extended edge portion $309_b$ extends along surface $S_o$ of PV panel $305_b$, whereas edge portion $309_a$ extends along back surface $S_u$ of PV panel $305_a$. The plate 307 carries a rubber-elastic member 317 which contacts, along the second extended edge portion $309_b$, the PV panel $305_b$ at its backside Su. Thus, the edge of the PV panel $305_b$ is squeezed between a scratch protection member 319 mounted to the edge portion of plate 307 and the elastic member 317. This squeeze or bias might, if necessary, be adjusted by means of a biasing screw 321 and/or may be optimized by the spring-like elasticity of the extended edge portion $309_b$ of the plate 315. Instead of a biasing screw 321 a a rivet may be provided if no adjustment is necessary.

The first extended edge portion $309_a$ of plate 315 carries an elastic member 323. A biasing or fixating plate 325 is pivotably mounted to the plate 315, pivotably about an axis A which is substantially perpendicular to the plane $E_A$ of the surface $S_o$ of the PV panel $305_a$. By pivotably bringing the biasing or fixating plate 325 in the position as shown in FIG. 19 the edge of PV panel $305_a$ is squeezed or biased towards the elastic member 323 on one hand to fixate the overall mechanically biased sealing arrangement 307 and on the hand to provide for a water seal.

By means of a biasing screw 327 the squeezing force of elastic member 323 towards the backside of PV panel $305_a$ may be adjusted if necessary.

Please note that two or more of the biasing or supporting members 325 are provided along the y extent of the plate 315.

In FIG. 20 there is shown the cross-section through the water collecting channel arrangement 310 as has been described with the help of schematic FIG. 18. The channel profile 330 which extends in x direction is mounted to a covering plate 332 which extends all along the extent of the channel profile 330. The channel profile 330 is suspended to the covering plate 332 by screws 334, several of which being distributed along the x direction of the extent of the channel profile 330 as well as of the covering plate 332. The channel profile 330 comprises shoulders 335, whereupon elastic sealing members rest which latter extend all along the x extent of channel profile 330 and covering plate 332. The respective PV panels $305_{a1}$ and $305_{a2}$ as of FIG. 18 are biased or squeezed between the respective extended elastic sealing member 337, as of an elastic shim, and the backside of the covering plate 332 which is provided with scratch-protecting members 339 along its extended edges. Thus, the embodiment according to FIG. 20 does not have any hook suspensions for the channel profile 330 as were addressed in context with FIG. 18, but the water collection channel arrangement 310 with channel profile 330 is suspended to a covering plate 332 which latter squeezes the respective edges of the PV panels towards and onto elastic sealing members 337 provided along the water collection channel arrangement with channel profile 330.

It has to be noted that the covering plate 332, with an eye on FIG. 18, is to be considered extending all along the gaps 303 and 304 and bridges area 306 above the respective members $307_i$, $307_2$.

In FIG. 17 there is schematically shown a cross-section through the water collection channel arrangement as of FIG. 18, whereat such arrangement is mounted by means of hooks 340 to members or plates of the respective building construction surface elements with PV panels $305_{a1}$, $305_{a2}$, such members being denoted in FIG. 17 by the reference number $3_c$ addressing, with an eye on FIG. 1 that such additional members may be realized by the mounting plate 3 of the embodiment of FIG. 1. A covering plate $332_a$ shown in dashed line in FIG. 17 may, in this type of mount, be mounted by means of respective screws $334_a$ between the upper side of covering plate 332a and the bottom part of the water collection channel arrangement 310. Also this possibility is shown in FIG. 17 in dashed line.

If at least one of the covering plates 332, $332_a$ and of the channel profiles 330 comprises a metal part which extends all along such arrangement 310 or plate and the mechanically biased sealing arrangement 307 as well comprise at least one metallic part extending all along the extent of such an arrangement, in a good embodiment all such metallic members or parts are mutually electrically connected so as to form a continuous grid or pattern of electric conductors along the building construction and thus along the building whereupon such building construction is provided. Thereby, such grid may be exploited as a part of a lightning protection system for the overall building.

The invention claimed is:

1. A building construction surface element comprising:
    a photovoltaic (PV) solar panel with a surface to be exposed to solar light and a back surface;
    a mounting plate with a mounting surface and a rear surface, the mounting surface being parallel to and spaced from said back surface by a venting interspace extending substantially all along said back surface and said mounting surface, and wherein said mounting plate extends substantially all along said back surface;
    a spacer arrangement fixed to said back surface and to said mounting surface and holding said back surface in spaced position from said mounting surface, and wherein said spacer arrangement comprises distributed spacers between said back surface and said mounting surface; and
    a thermal insulation plate fixed to said rear surface and extending substantially all along said rear surface.

2. The building construction surface element according to claim 1, wherein the distributed spacers of said spacer arrangement comprise at least one of:
    hollow or fullmaterial studs,
    hollow or fullmaterial linear or curved bars, and
    framework bars.

3. The building construction surface element according to claim 2, wherein said spacers are at least one of (i) a profiled section of said mounting plate, and (ii) distinct elements.

4. The building construction surface element according to claim 1, wherein said PV panel is glued to said spacer arrangement.

5. The building construction surface element according to claim 1, wherein said mounting plate is of a metal or of a plastic material.

6. The building construction surface element according to claim 1, further comprising:
    at least one membrane band of waterproof material sealingly mounted along at least a part of a periphery of said mounting plate and/or of said PV panel and having a width, the at least one membrane being mounted to said mounting plate and/or said PV panel so as to freely project over a border of said mounting plate and/or said PV panel by a part of a width of the at least one membrane.

7. The building construction surface element according to claim 1, further comprising:
    at least one sealing member extending along at least a part of a periphery of at least one of (i) said surface of said PV panel to be exposed to solar light, (ii) said back surface of said PV panel, and (iii) said mounting plate.

8. The building construction surface element according to claim 1, further comprising:
    a further mounting plate along said thermal insulation plate and opposite said mounting plate.

9. The building construction surface element according to claim 8, wherein said further mounting plate is of a plastic material or a metal.

10. The building construction surface element according to claim 8, wherein said thermal insulation plate is squeezed between said mounting plate and said further mounting plate by means of tie bars mounted to said mounting plate and said further mounting plate, at least a part of a length of the tie bars being of thermally nonconductive material.

11. The building construction surface element according to claim 1, wherein said thermal insulation plate is glued to said mounting plate.

12. The building construction surface element according to claim 8, wherein said further mounting plate is glued to said thermal insulation plate.

13. The building construction surface element according to claim 1, wherein said thermal insulation plate is of or comprises a plate-layer of rock wool.

14. A building construction comprising at least two of the building construction surface elements according to claim 1, at least one thereof comprising at least one membrane band of waterproof material sealingly mounted along at least a part of the periphery of said mounting plate and/or of said PV panel and having a width and being mounted to said mounting plate and/or PV panel so as to freely project over the border of said mounting plate and/or PV panel by a part of its width extent, wherein said building construction surface elements are mounted side by side and mutually separate by a gap, and wherein the at least one membrane band of waterproof material of at least one of said building construction surface elements bridges at least a part of said gap.

15. A building construction comprising at least two building construction surface elements with an outermost PV panel each and according to claim 1, wherein said at least two building construction surface elements are mounted side by side and mutually separate by a gap, comprising a mechanically biased sealing arrangement bridging said gap along the edges of at least one of said PV-panels and of said mounting plates.

16. The building construction of claim 14 comprising a mechanically biased sealing arrangement bridging said gap along the edges of said PV-panels.

17. The building construction of claim 16 said mechanically biased sealing arrangement comprising at least one elongated bridging plate arrangement bridging said gap and comprising a first extended edge portion overlapping the PV panel of the one of the building construction surface elements along its back surface, and comprising a second extended edge portion, extending substantially parallel to the first extended edge portion, said second edge portion overlapping the PV panel of the second of said at least two building construction surface elements, along its surface to be exposed to solar light.

18. The building construction of claim 17 wherein said surface to be exposed to solar light and said back surface extend along planes, said planes being one common plane or spaced apart or intersecting planes.

19. The building construction of claim 17, said first extended edge portion comprising a first extended sealing member biased towards said back surface and/or said second extended edge portion comprising a second extended sealing member biased towards one of said surface to be exposed to solar light and of said back surface.

20. The building construction of claim 17, wherein first and second extended edge portions are part of a plate member.

21. The building construction of claim 17, wherein said first and second extended edge portions are linked by an extended central part, said elongated bridging plate arrangement comprising at least one of a biasing member mounted to said central part and applicable in an overlapping manner over the surface to be exposed to solar light opposite said first extended edge portion and of a biasing member mounted to said central part and applicable in an overlapping manner over the back surface opposite said second extended edge portion.

22. The building construction of claim 21, wherein said at least one biasing member is mounted pivotably on said extended central part, pivotably about an axis substantially perpendicular to that surface to which it is to be applied to in an overlapping manner.

23. The building construction of claim 17 wherein said PV panels of said at least two building construction surface elements are positioned inclined with respect to vertical orientation and wherein said elongated bridging plate arrangement extends substantially in horizontal orientation, said first extended edge portion being located on a higher positioning level than said second extended edge portion.

24. The building construction of claim 17, comprising at least four of said building construction surface elements, wherein said building construction surface elements are mounted crosswise side by side and mutually separate by two intersecting gaps, said mechanically biased sealing arrangement bridging one of said intersecting gaps, comprising a further mechanically biased sealing arrangement bridging the second of said two intersecting gaps and comprising an extended water collection channel extending below and crossing in an overlapping manner at least an end portion of said mechanically biased sealing arrangement in and bridging a gap area defined by the intersection of said two gaps.

25. The building construction of claim 24 said further mechanically biased sealing arrangement comprising an extended cover plate arrangement extending along and covering said water collection channel and crossing in an overlapping manner at least an end portion of said mechanically biased sealing arrangement in and bridging said gap area, said cover plate arrangement being mounted to said water collection channel.

26. The building construction of claim 14, wherein either both of said building construction surface elements are constructed comprising at least one membrane band of waterproof material sealingly mounted along at least a part of the periphery of said mounting plate and/or of said PV panel and having a width and being mounted to said mounting plate and/or PV panel so as to freely project over the border of said mounting plate and/or PV panel by a part of its width extent, and said bands of waterproof material conjointly bridge said gap between said mounting plates or said PV panels or one of said building construction surface elements is constructed comprising at least one membrane band of waterproof material sealingly mounted along at least a part of the periphery of said mounting plate and/or of said PV panel and having a width and being mounted to said mounting plate and/or PV panel so as to freely project over the border of said mounting plate and/or PV panel by a part of its width extent and said one band bridges said gap between said mounting plates or said PV panels.

27. The building construction according to claim 15, said mechanically biased sealing arrangement comprising
at least one elongated bridging plate extending along said gap and overlapping the edges of said PV-panels along one of said back-surfaces and of said surfaces to be exposed to solar light and/or the edges of said mounting plates
at least one pair of elongated sealing members extending all along said gap and between said bridging plate and the back surfaces or the surfaces to be exposed to solar light of said PV-panels and/or one of the surfaces of said mounting plates,
each of said elongated sealing members being one of a separately applied member, a member fixed to said elongated bridging plate and of a member fixed, preferably glued, to one of said back surfaces, of said surfaces to be exposed to solar light, to the mounting surface of said mounting plate, to the rear surface of said mounting plate and further comprising
at least one biasing member bridging said gap and overlapping the surfaces opposed to said surfaces with said elongated sealing members
said elongated bridging plate and said at least one biasing member being mutually biased.

28. The building construction according to claim 27, wherein said biasing member is a further elongated bridging plate extending along said gap.

29. The building construction according to claim 28 comprising at least one further pair of said elongated sealing members between said further elongated bridging plate and respective surfaces of said PV panel and/or of said mounting plates.

30. The building construction according to claim 27, comprising at least two biasing plates, distributed along said gap and resting on said surfaces opposed to said PV panels and/or mounting plates preferably via rubber-elastic members.

31. The building construction according to claim 27, said at least one elongated bridging plate overlapping the back surfaces of said PV-panels.

32. The building construction according to claim 15, further comprising at least four of said building construction surface elements wherein said at least four building construction surface elements are mounted side by side and mutually separate by a cross of gaps, one of said mechanically biased sealing arrangement bridging each of said gaps of said cross and terminating adjacent a center area of said cross and further comprising a cross-center mechanically biased sealing arrangement sealingly interconnecting said mechanically biased sealing arrangements and the four corners of said building construction surface elements bordering said center area.

33. The building construction according to claim 27, further comprising at least four of said building construction surface elements wherein said at least four building construction surface elements are mounted side by side and mutually separate by a cross of gaps, one of said elongated bridging plates bridging each of said gaps of said cross along the edges of respective PV-panels and/or mounting plates and terminating adjacent a center area of said cross, further comprising
- a cross center sealing arrangement comprising at least one cross-center covering plate overlapping the four neighboring corners of said four building construction surface elements
- a seal member loop along the periphery of said cross-center covering plate and between said cross center covering plate said four neighboring corners and the ends of said four elongated bridging plates
- a biasing cross-center member bridging said center area of said cross and overlapping at least one of said four corners and of said four elongated bridging plates said biasing cross-center member and said cross center covering plate being mutually biased by at least one tensioning bar.

34. The building construction of claim 15 said mechanically biased sealing arrangement and said further mechanically biased sealing arrangement, if provided, being part of a lightning protection system.

* * * * *